US012604611B2

(12) United States Patent
Kim et al.

(10) Patent No.: US 12,604,611 B2
(45) Date of Patent: Apr. 14, 2026

(54) DISPLAY DEVICE

(71) Applicant: LG DISPLAY CO., LTD., Seoul (KR)

(72) Inventors: Min Jee Kim, Seoul (KR); Seok Hyun Kim, Seoul (KR); Kwan Soo Kim, Seoul (KR); Young Nam Lim, Seoul (KR); Jae Hyeon Kim, Seoul (KR); Min Geun Song, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 760 days.

(21) Appl. No.: 17/547,080

(22) Filed: Dec. 9, 2021

(65) Prior Publication Data

US 2022/0209161 A1    Jun. 30, 2022

(30) Foreign Application Priority Data

Dec. 28, 2020    (KR) ........................ 10-2020-0185297

(51) Int. Cl.
| | |
|---|---|
| *H10K 59/121* | (2023.01) |
| *H10K 50/17* | (2023.01) |
| *H10K 59/12* | (2023.01) |
| *H10K 59/80* | (2023.01) |
| *H10K 102/00* | (2023.01) |

(52) U.S. Cl.
CPC ......... *H10K 59/121* (2023.02); *H10K 50/171* (2023.02); *H10K 59/12* (2023.02); *H10K 59/80521* (2023.02); *H10K 59/873* (2023.02); *H10K 59/875* (2023.02); *H10K 2102/351* (2023.02)

(58) Field of Classification Search
None
See application file for complete search history.

(56) References Cited

U.S. PATENT DOCUMENTS

| | | | | |
|---|---|---|---|---|
| 12,439,800 B2 * | 10/2025 | Beon | ..................... | H10K 59/60 |
| 2013/0032840 A1 * | 2/2013 | Cho | ................... | H10K 50/814 |
| | | | | 257/E51.019 |
| 2013/0161656 A1 | 6/2013 | Choi et al. | | |
| 2013/0187131 A1 | 7/2013 | Chung et al. | | |
| 2013/0256638 A1 * | 10/2013 | Uesugi | ................ | H10K 50/805 |
| | | | | 438/34 |
| 2014/0246664 A1 * | 9/2014 | Shoda | ............. | H10K 59/80524 |
| | | | | 438/34 |

(Continued)

FOREIGN PATENT DOCUMENTS

| | | |
|---|---|---|
| KR | 10-1275810 B1 | 6/2013 |
| KR | 10-2013-0073721 A | 7/2013 |

(Continued)

*Primary Examiner* — Steven B Gauthier
*Assistant Examiner* — E. Rhett Cheek
(74) *Attorney, Agent, or Firm* — Morgan, Lewis & Bockius LLP

(57) ABSTRACT
A display device includes: a substrate including: a first region, and a second region, an anode at the first region, an organic layer on the anode at the first region, and on the second region, an electron injection layer on the organic layer at the first region and the second region, the electron injection layer including a first metal, a cathode on the electron injection layer at the first region, the cathode including a second metal having a greater work function than a work function of the first metal, and a capping layer on the cathode at the first region, and on the electron injection layer at the second region.

29 Claims, 31 Drawing Sheets

(56)     References Cited

U.S. PATENT DOCUMENTS

| | | | | |
|---|---|---|---|---|
| 2015/0048331 A1 | | 2/2015 | Kwack et al. | |
| 2016/0351119 A1* | | 12/2016 | Ono | H10K 71/00 |
| 2017/0373282 A1 | | 12/2017 | Kim et al. | |
| 2018/0005574 A1* | | 1/2018 | Kim | H10K 50/818 |
| 2018/0062104 A1 | | 3/2018 | Kwon et al. | |
| 2018/0145119 A1* | | 5/2018 | Choi | H10K 50/131 |
| 2019/0165072 A1* | | 5/2019 | Wang | H01L 27/1255 |
| 2019/0207132 A1 | | 7/2019 | Park et al. | |
| 2019/0355793 A1* | | 11/2019 | Oh | H10K 59/122 |
| 2019/0372057 A1 | | 12/2019 | Park et al. | |
| 2020/0098933 A1* | | 3/2020 | Tanaka | H01L 21/02565 |
| 2020/0251542 A1* | | 8/2020 | Fu | H10K 59/122 |
| 2020/0274089 A1* | | 8/2020 | Son | H10K 59/122 |
| 2021/0111364 A1* | | 4/2021 | Sakamoto | H10K 59/8731 |
| 2022/0052129 A1* | | 2/2022 | Kim | H10K 59/8792 |
| 2022/0123081 A1* | | 4/2022 | Park | H10K 59/353 |

FOREIGN PATENT DOCUMENTS

| | | | |
|---|---|---|---|
| KR | 10-2016-0032970 A | 3/2016 |
| KR | 10-2018-0002115 A | 1/2018 |
| KR | 10-2018-0025060 A | 3/2018 |
| KR | 10-2019-0081854 A | 7/2019 |
| KR | 10-2019-0135848 A | 12/2019 |
| KR | 10-2093393 B1 | 3/2020 |
| KR | 10-2020-0058891 A | 5/2020 |

* cited by examiner 170    130

CTE5<CTE4<CTE3<CTE2<CTE1

Metal thin film reflectance

FIG. 20

| CPL (380) |
|---|
| Cathode (370) |
| EIL 2 (Yb : Ag) (362) |
| EIL 1 (Yb) (361) |
| ETL 2 (242) |
| EML 2 (260) |
| HTL 2 (241) |
| P-CGL (232) |
| N-CGL (231) |
| ETL 1 (223) |
| EML 1 (250) |
| HTL 1 (222) |
| HIL (221) |

360 (spans EIL 2 and EIL 1)

110c
110b
110a

DISPLAY DEVICE

CROSS-REFERENCE TO RELATED APPLICATION(S)

This application claims the benefit of and priority to Korean Patent Application No. 10-2020-0185297, filed on Dec. 28, 2020, the entirety of which is hereby incorporated by reference.

BACKGROUND

1. Technical Field

The present disclosure relates to a display device, and more particularly, to a display device that changes a structure adjacent to a cathode (common electrode) in a structure including the patterned cathode formed of a single metal to reduce or prevent a defect of the cathode and improve high-temperature reliability.

2. Discussion of the Related Art

Self-light-emitting display devices, such as an organic light-emitting display device and a quantum dot display device, which do not require a separate light source and achieve compactness and clear color display, are being considered as competitive applications. A self-light-emitting display device includes a plurality of subpixels disposed on a substrate, and each subpixel includes a light-emitting diode including two electrodes disposed opposite each other and an emission layer located between the two electrodes.

Recently, such a self-light-emitting display device is being applied as a transparent display device which may emit light and enable a user to see therethrough. Display devices may be applied as various applications, and, for example, may be used as a transparent display device or a type combined with other components, such as a camera. A transparent display device or a display device having a camera may require patterning of constitutive members to increase transmittance.

SUMMARY

Accordingly, the present disclosure is directed to a display device that substantially obviates one or more of the issues due to limitations and disadvantages of the related art.

Therefore, the present disclosure proposes a display device, which may increase transmittance by patterning a constitutive member including a metal, and may reduce or prevent changes in the patterned constitutive member and elements adjacent thereto to reduce or prevent a display defect. The display device may improve reliability in response to changes over time and high-temperature reliability.

An object of the present disclosure is to provide a display device in which, even when a cathode formed of a single metal is provided in selective regions, a structure having similar thermal expansion characteristics to the cathode is provided as an upper structure or an electron injection layer formed of a metal alloy and configured to induce stable thinning of the cathode, and to promote high-temperature stability, is provided as a lower structure to improve stability of the display device and reliability thereof when the display device is driven at a high temperature.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts as embodied and broadly described, there is provided a display device, including: a substrate including: a first region, and a second region, an anode at the first region, an organic layer on the anode at the first region, and on the second region, an electron injection layer on the organic layer at the first region and the second region, the electron injection layer including a first metal, a cathode on the electron injection layer at the first region, the cathode including a second metal having a greater work function than a work function of the first metal, and a capping layer on the cathode at the first region, and on the electron injection layer at the second region.

In another aspect, there is provided a display device, including: a substrate including: an emission part, and a transmission part, an anode at the emission part, an organic layer on the anode at the emission part, and on the transmission part, an electron injection layer on the organic layer, the electron injection layer including: an alloy including a first metal having an electron-injecting property, and a second metal having a surface energy greater than or equal to 1 J/m2, a cathode on the electron injection layer at the emission part, the cathode including a single metal having a work function between work functions of the first metal and the second metal, and a capping layer on the cathode, the capping layer having a lower coefficient of thermal expansion than a coefficient of thermal expansion of the cathode.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages may be discussed below in conjunction with embodiments of the disclosure. It is to be understood that both the foregoing general description and the following detailed description of the present disclosure may be examples and explanatory, and may be intended to provide further explanation of the disclosure as claimed.

BRIEF DESCRIPTION OF THE DRAWINGS

The accompanying drawings, that may be included to provide a further understanding of the disclosure and may be incorporated in and constitute a part of this disclosure, illustrate embodiments of the disclosure and together with the description serve to explain various principles of the disclosure.

FIG. 20 is a longitudinal-sectional view of a light-emitting device according to a sixth embodiment of the present disclosure.

Figure 1:
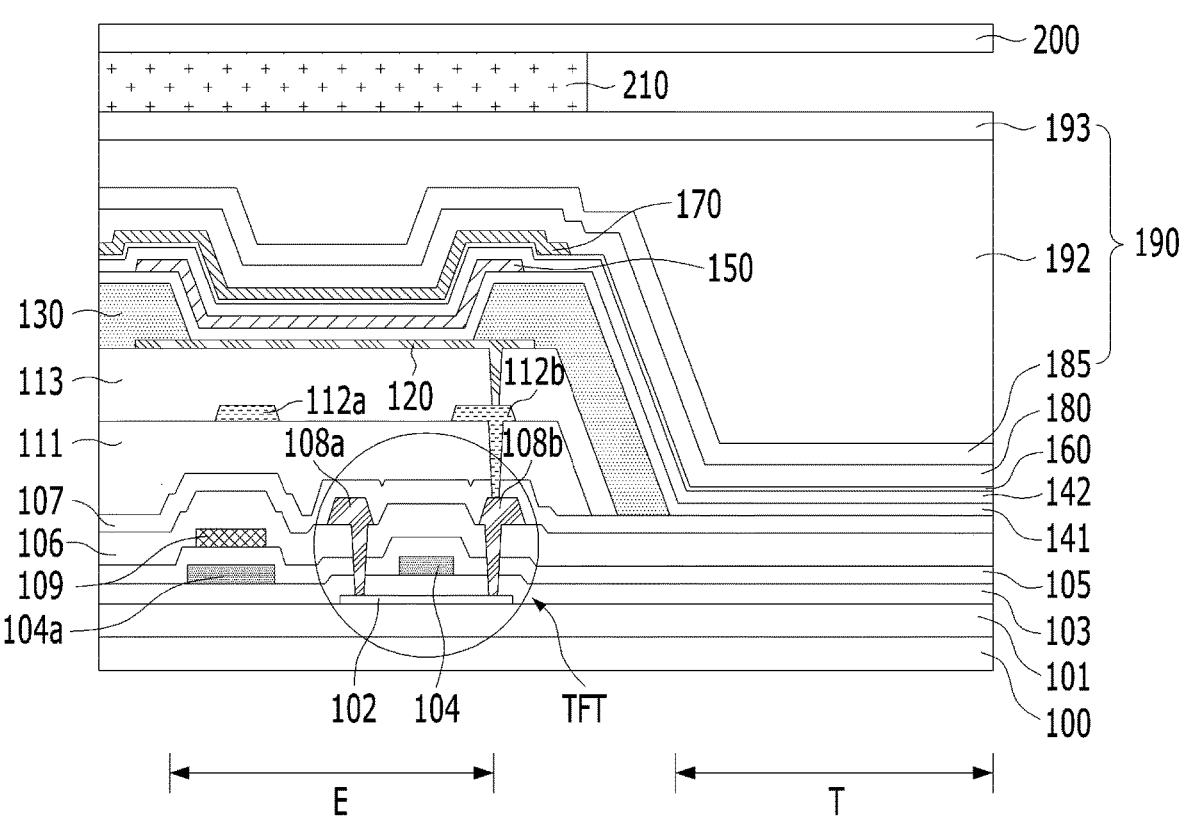
FIG. 1 is a longitudinal-sectional view of a display device according to a first embodiment of the present disclosure.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to embodiments of the present disclosure, examples of which may be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations may be selected only for convenience of writing the specification and may be thus different from those used in actual products.

Advantages and features of the present disclosure, and implementation methods thereof will be clarified through following example embodiments described with reference to the accompanying drawings. The present disclosure may, however, be embodied in different forms and should not be construed as limited to the example embodiments set forth herein. Rather, these example embodiments may be provided so that this disclosure may be sufficiently thorough and complete to assist those skilled in the art to fully understand the scope of the present disclosure. Further, the present disclosure is only defined by scopes of claims.

A shape, a size, a ratio, an angle, and a number disclosed in the drawings for describing embodiments of the present disclosure may be merely an example. Thus, the present disclosure is not limited to the illustrated details. Like reference numerals refer to like elements throughout. In the following description, when the detailed description of the relevant known function or configuration is determined to unnecessarily obscure an important point of the present disclosure, the detailed description of such known function or configuration may be omitted. When terms "include," "have," and "include" described in the present disclosure may be used, another part may be added unless a more limiting term, such as "only," is used. The terms of a singular form may include plural forms unless referred to the contrary.

In construing an element, the element is construed as including an error or tolerance range even where no explicit description of such an error or tolerance range. In describing a position relationship, when a position relation between two parts is described as, for example, "on," "over," "under," or "next," one or more other parts may be disposed between the two parts unless a more limiting term, such as "just" or "direct(ly)," is used. In describing a time relationship, when the temporal order is described as, for example, "after," "subsequent," "next," or "before," a case that is not continuous may be included, unless a more limiting term, such as "just," "immediate(ly)," or "direct(ly)," is used.

It will be understood that, although the terms "first," "second," etc. May be used herein to describe various elements, these elements should not be limited by these terms. These terms may be only used to distinguish one element from another. For example, a first element could be termed a second element, and, similarly, a second element could be termed a first element, without departing from the scope of the present disclosure.

In describing elements of the present disclosure, the terms like "first," "second," "A," "B," "(a)," and "(b)" may be used. These terms may be merely for differentiating one element from another element, and the essence, sequence, order, or number of a corresponding element should not be limited by the terms. Also, when an element or layer is described as being "connected," "coupled," or "adhered" to another element or layer, the element or layer can not only be directly connected or adhered to that other element or layer, but also be indirectly connected or adhered to the other element or layer with one or more intervening elements or layers "disposed" between the elements or layers, unless otherwise specified.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

In the description of embodiments, when a structure is described as being positioned "on or above" or "under or below" another structure, this description should be construed as including a case in which the structures contact each other as well as a case in which a third structure is disposed therebetween. The size and thickness of each element shown in the drawings may be given merely for the convenience of description, and embodiments of the present disclosure may be not limited thereto.

Features of various embodiments of the present disclosure may be partially or overall coupled to or combined with each other, and may be variously inter-operated with each other and driven technically as those skilled in the art can sufficiently understand. Embodiments of the present disclosure may be carried out independently from each other, or may be carried out together in co-dependent relationship.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning for example consistent with their meaning in the context of the relevant art and should not be interpreted in an idealized or overly formal sense unless expressly so defined herein. For example, the term "part" or "unit" may apply, for example, to a separate circuit or structure, an integrated circuit, a computational block of a circuit device, or any structure configured to perform a described function as should be understood to one of ordinary skill in the art.

Hereinafter, example embodiments of the present disclosure will be described in detail with reference to the accompanying drawings.

Figure 2:
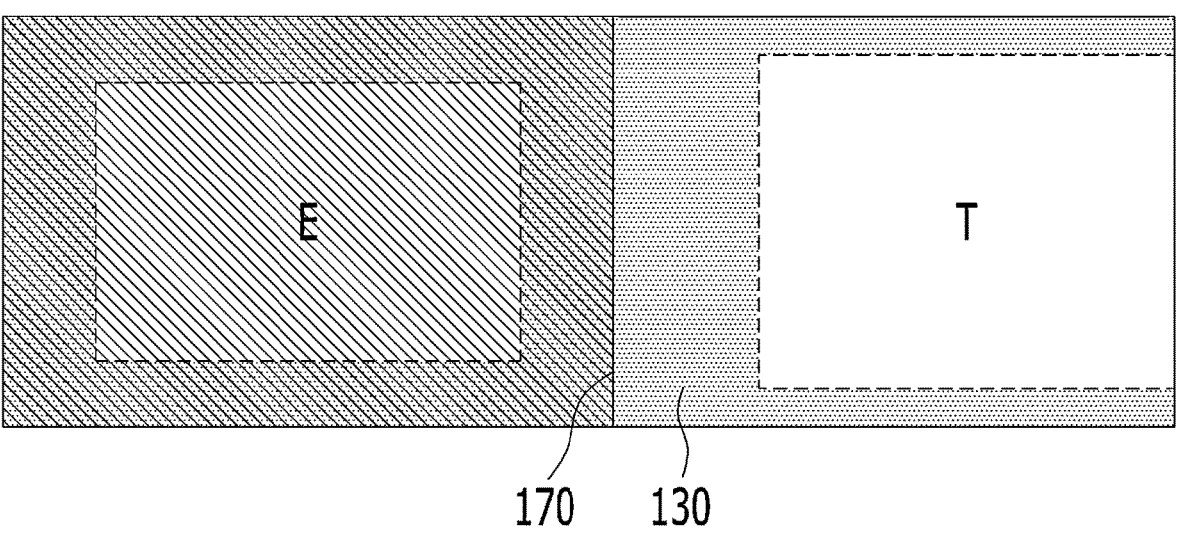
FIG. 2 is a plan view of the display device according to the first embodiment of the present disclosure.

FIG. 1 is a longitudinal-sectional view of a display device according to a first embodiment of the present disclosure. FIG. 2 is a plan view of the display device according to the first embodiment of the present disclosure.

As shown in FIG. 1, the display device according to the first embodiment of the present disclosure may include a substrate 100 having first regions E and second regions T, an anode 120 provided in the first regions E, at least one organic layer 141 and/or 142 provided on the anode 120 in the first regions E and provided in the second regions T. The display device may further include an electron injection layer 160 provided on the at least one organic layer 141 and/or 142 in the first regions E and the second regions T, a cathode 170 provided on the electron injection layer 160 in the first regions E, and a capping layer 180 provided on the cathode 170 in the first regions E and provided on the electron injection layer 160 in the second regions T. In the display device according to the first embodiment of the present disclosure, the first regions E may be emission parts, and the second regions T may be transmission parts.

In the first regions E, an emission layer 150 may be provided between the anode 120 and the cathode 170. When a differential voltage is applied between the anode 120 and the cathode 170, current may flow between the anode 120 and the cathode 170. Thereby, the emission layer 150 may be driven to emit light.

Further, the second regions T may not have the anode 120, the emission layer 150, and the cathode 170, in contrast to the first regions E. The second regions T may transmit an image under the substrate 100 upwards, regardless of the light-emitting operation of the first regions E.

A vertical configuration, including the anode 120, the cathode 170, and the organic layers 141 and 142, including the emission layer 150 interposed between the anode 120 and the cathode 170, is referred to as a "light-emitting device." Among the organic layers 141 and 142 of the light-emitting device, a first common layer 141, located under the light-emitting layer 150, may include at least one layer relating to hole injection and hole transport, e.g., a hole injection layer, a hole transport layer, and/or an electron barrier layer. Further, a second common layer 142 located on the light-emitting layer 150 may include a hole barrier layer configured to reduce or prevent holes from escaping from the emission layer 150, or an electron transport layer relating to electron transport.

A plurality of emission parts E and a plurality of transmission parts T may be provided on the substrate 100, and the anode 120 may be selectively provided in the emission parts E. The emission parts E may be divided from one another by a bank 130 shown in the examples of FIGS. 1 and 2. The emission parts E may include emission parts E configured to emit light with different colors, for example, red, green, and blue emission parts E. However, colors of light emitted by the emission parts E are not limited to red, green, and blue, and combinations of other colors, for example, magenta, cyan, and yellow, may be used. The emission parts E configured to emit light with the respective colors may have a rectangular shape, as shown in FIG. 2, without being limited thereto, or may have other polygonal shapes. Further, the emission parts E may have a shape, the corners of which may be rounded. The emission parts E and the transmission parts T may be formed to have the same size and/or to be at the same rate as each other, or may be formed to have different sizes and/or to be at different rates from each other. For example, one transmission part T may be arranged per a set of one red emission part E, one green emission part E, and one blue emission part E, or the transmission part T may be arranged per each of the red, green, and blue emission parts E in a ratio of 1:1 or 1:n (n being a natural number greater than or equal to 2).

In the emission parts E and the transmission parts T, the first and second common layers 141 and 142 may be formed in common. One reason for this is that, when the first and second common layers 141 and 142 are formed, the first and second common layers 141 and 142 may be formed integrally throughout the active area of the substrate 100, without using a metal fine mask. The first and second common layers 141 and 142 may have very thin thicknesses and be optically transparent to scarcely influence transmission.

The anode 120 may be provided by stacking one reflective metal layer and one or more transparent metal layers. In the light-emitting device provided in the emission part E, because light emitted by the emission layer 150 may repeat resonance between the anode 120 and the cathode 170, and may be finally transmitted through the cathode 170, the cathode 170 should be reflective to repeatedly re-reflect light on the inner surface thereof opposite the anode 120, and should be transmissive to finally transmit light.

Although the light-emitting device is illustrated as having a single emission layer, the light-emitting device is not limited thereto, and may have a plurality of emission layers. In some cases, the light-emitting device may have a plurality of stacks separated from each other by a charge generation layer, and may have a structure in which each stack includes at least one emission layer.

Further, in the description of the present disclosure, the anode 120 may include a reflective electrode, the cathode 170 may be transflective, and the anode 120 and the cathode 170 may serve as the anode and the cathode of each light-emitting device. A transparent electrode may be further provided on the upper surface and/or the lower surface of the reflective electrode of the anode 120.

The cathode 170 of the present disclosure may be formed integrally throughout a plurality of emission parts E provided on the substrate 100, and may thus be referred to as a "common electrode." In some cases, the anode 120 may be referred to as a "first electrode" and the cathode 170 may be referred to as a "second electrode" of the light-emitting device.

The cathode 170 of the present disclosure may be formed of a transflective metal to serve as the cathode of each light-emitting device. Further, because the cathode 170 of the present disclosure should maintain a regular potential throughout all the emission parts E of the substrate 100 in the state in which the cathode 170 is removed from the transmission parts T, the cathode 170 may be formed of a single metal having a low sheet resistance and a low work function which is lower than or equal to 4 eV. For example, the cathode 170 may be formed of a single metal, such as magnesium (Mg).

Aluminum (Al) has a work function of 4.28 eV; silver (Ag) has a work function of 4.52 eV to 4.74 eV; a silver-magnesium alloy (MgAg) has a work function of 4.12 eV. In contrast, magnesium (Mg) has a work function of 3.66 eV. When the cathode 170 is formed of magnesium (Mg) the cathode 170 may facilitate electron injection. Furthermore, silver (Ag) or a silver alloy has high bonding properties to organic matter during a cathode deposition process, thus making it difficult to pattern a cathode formed of silver or the silver alloy to remove parts of the cathode after deposition.

In comparison, when a cathode is formed of magnesium (Mg), having different properties from organic matter, some parts of the cathode may be removed on the organic matter through patterning.

However, the cathode 170 of the present disclosure is not limited to magnesium (Mg), and may be formed of any transflective metal which has a work function less than or equal to 4 eV, and may not cause a defect at the interface with an adjacent layer, which will be described later.

Here, a reason why the cathode 170 may be removed from the transmission parts T is to reduce or prevent transmittance degradation due to the transflective cathode 170 in the transmission parts T.

A well-known top emission-type light-emitting display device uses an AgMg alloy as a transflective metal. In this case, when a cathode formed of the AgMg alloy is patterned, the sheet resistance of the cathode may be greatly increased due to high resistivity of Ag. Thus, it may be required to maintain phase voltage through an auxiliary electrode.

In the display device according to the present disclosure, when the cathode 170 is formed of a single metal having high conductivity, even though the cathode 170 is patterned, an increase in sheet resistance due to use of the AgMg alloy may be solved.

Further, the structure of the present disclosure, in which the cathode 170 formed of a single metal is patterned, may improve bonding properties of the cathode 170 to elements provided on the upper and lower surfaces of the cathode 170, thus being capable of reducing or preventing a display defect and improving reliability of the display device. Concretely, this will be described in relation to the description of the following tests.

The electron injection layer 160 located between the cathode 170 and the second common layer 142 may serve to reduce or prevent heterogeneity at the interface between the cathode 170 and the organic layer 142 provided thereunder, and to facilitate electron injection, and may include a metal having electron-injecting properties, e.g., having a low work function. For example, the work function of the electron-injecting metal of the electron injection layer 160 is lower than or equal to 3 eV, and is lower than the single metal forming the cathode 170. For example, the electron injection layer 160 may be formed of one or more of barium (Ba), calcium (Ca), and strontium (Sr), which have a low work function lower than that of the cathode 170, thus being capable of facilitating injection of electrons from the cathode 170.

Further, the capping layer 180 located on the cathode 170 may have the basic functions of improving extraction of light emitted by the light-emitting devices provided thereunder and protecting the light-emitting devices, and may have excellent bonding properties at the interface to the cathode 170, which may be formed of a single metal, and may be patterned.

For example, the capping layer 180 may be formed of a material having a lower coefficient of thermal expansion than that of the cathode 170, and thus may have a compressive force in the opposite direction to the tensile direction of the cathode 170, even in an environment in which the cathode 170 may be tensioned, for example, at a high temperature, thereby being capable of reducing or preventing migration of a single metal component forming the cathode 170. Therefore, the capping layer 180 may restrict migration of the metal component forming cathode 170 to reduce the diffusion distance of the metal component, thus being capable of reducing or preventing a display defect, such as a sand grain effect.

For reference, the "sand grain effect" refers to unstable surface properties of the display device when the display device is stored at a high temperature for a designated time, and thus metal atoms are rearranged due to migration thereof. For example, the sand grain effect refers to a phenomenon in which metal atoms move in a direction of decreasing a defect due to partial formation of grains, vacancies, and pores of the metal atoms in a formed film, and thus form new grains, and rearranged or recrystallized grains caused by a restoration or recrystallization process look like grains of sand.

For example, when a cathode, which is to be patterned, is formed of magnesium (Mg), which has a low work function and is transflective, and a capping layer formed of an organic material, are provided on the cathode formed of magnesium (Mg), tensile force may occur in the high-temperature environment due to the high coefficient of thermal expansion of the organic material. The cathode may also be tensioned together with the capping layer due to the tensile force of the capping layer. In this case, diffusion of magnesium in the cathode may be increased or maximized, and the sand grain effect may occur.

In the display device according to the present disclosure, the capping layer 180 may be formed of a material having a lower coefficient of thermal expansion than that of the material of the cathode 170, thereby being capable of reducing or preventing the sand grain effect caused by tensile stress at a high temperature. The capping layer 180 may be formed of a metal fluoride having a lower coefficient of thermal expansion than that of the metal forming the cathode 170. A metal included in the metal fluoride may be, for example, an alkaline-earth metal or a transition metal. Magnesium fluoride ($MgF_2$) or the like may be used as an alkaline-earth metal fluoride, and ytterbium fluoride ($YbF_3$) or the like may be used as a transition metal fluoride. The coefficient of thermal expansion of $MgF_2$ is lower than or equal to $10\times10^{-6}$ m/K, and the coefficient of thermal expansion of $YbF_3$ is $8.5\times10^{-6}$ m/K. On the other hand, the coefficient of thermal expansion of magnesium (Mg) is $26\times10^{-6}$ m/K.

That is, the coefficients of thermal expansion of the cathode 170 and the capping layer 180 according to one embodiment of the present disclosure may be decreased in the upward direction. Thus, the capping layer 180 may have a contractile force in the opposite direction to the tensile direction of the cathode 170 when the cathode 170 is tensioned, thereby reducing or preventing the cathode 170 from being tensioned, and thus reducing or preventing migration of the metal component forming the cathode 170 and the sand grain effect caused by diffusion of the metal component.

Hereinafter, elements, which are not described above with reference to FIG. 1, will be described.

A buffer layer 101 may be provided on the substrate 100 to reduce or prevent influence of impurities in the substrate 100. Thin-film transistors TFT, each of which may include an active layer 102 provided in a designated region on the buffer layer 101, a gate electrode 104 overlapping a part of the active layer 104 by interposing a gate insulating layer 103 between the active layer 102 and the gate electrode 104, and a source electrode 108a and a drain electrode 108b connected to both sides of the active layer 102, may be provided.

First and second interlayer insulating films 105 and 106 may be provided between the gate electrode 104 and the source and drain electrodes 108a and 108b. Any one of the first and second interlayer insulating films 105 and 106 may be omitted.

A storage capacitor may include a first storage electrode 104a formed in the same layer as the gate electrode 104, and a second storage electrode 104b provided on the first interlayer insulating film 105 or on the second interlayer insulating film 106 to overlap the first storage electrode 104a. Further, a protective film 107, configured to protect the thin-film transistors TFT, and first and second planarization films 111 and 113 may be sequentially formed.

The drain electrode 108b of the thin-film transistor TFT may be directly connected to the anode 120 of the light-emitting device by a contact hole formed through the protective film 107 and the first and second planarization films 111 and 113. Alternatively, the drain electrode 108b of the thin-film transistor TFT may be conductively connected to the anode 120 by a connection metal 112b provided on the first planarization film 111 and contact holes formed on and under the connection metal 112b, as shown in the example of FIG. 1.

Although not shown in FIG. 1, the connection metal 112b and an electrode pattern 112a may be used as a source electrode and a drain electrode of another thin-film transistor formed to have a different active layer in a different layer from the above-described thin-film transistor. In this case, the active layer 102, close to the substrate 100, may be a polysilicon layer, and the other active layer (not shown), located higher than the active layer 102, may be an oxide semiconductor layer.

The first and second planarization films 111 and 113 may be provided to planarize the layers provided thereunder. The first and second planarization films 111 and 113 may be formed of an organic material, such as photo acryl, benzo-cyclobutene (BCB), or the like. The first and second interlayer insulating films 105 and 106, the buffer layer 101, the gate insulating film 103, and the protective layer 107 may be formed of inorganic materials, e.g., may be oxide films, nitride films, or oxynitride films. Embodiments are not limited thereto. To increase transmittance in the transmission parts T, the first and second planarization films 111 and 113 and the bank 130 formed of organic materials may be removed from the transmission parts T.

The illustrated example shows a state in which the first and second planarization films 111 and 113 formed of organic materials and the second interlayer insulating film 106 and the protective film 107 formed of inorganic materials are removed from the transmission parts T. In some cases, the second interlayer insulating film 106 and the protective film 107 may be left in the transmission parts T. Alternatively, in some cases, among the insulating films formed of inorganic materials, an insulating film formed of an inorganic material having relatively low transmittance may be selectively removed.

Further, an encapsulation structure 190 may be provided on the capping layer 180 to seal, and to protect the elements provided under the encapsulation structure 190. The encapsulation structure 190 may be formed, for example, by alternately stacking inorganic encapsulation films 185 and 193 and an organic encapsulation film 192, or by forming the inorganic encapsulation film 185 on the capping layer 180, applying a face seal to the upper surface of the inorganic encapsulation film 185, and then bonding an opposite substrate 200 to the substrate 100 to be opposite each other.

In some cases, the substrate 100, provided with the inorganic encapsulation film 185 formed thereon, and the opposite substrate 200 may be bonded to each other by applying an edge seal to the edges thereof, instead of the face seal. A filler may fill a space between the substrate 100 and the opposite substrate 200, inside the edge seal.

When the capping layer 180 includes a material having a lower coefficient of thermal expansion than the material of the cathode 170, the inorganic encapsulation film 185 may have a lower coefficient of thermal expansion than the material of the capping layer 180. As such, the coefficients of thermal expansion of the cathode 170, the capping layer 180, and the inorganic encapsulation film 185 may be gradually decreased in the upward direction, thus being capable of improving the sand grain effect prevention effect due to prevention of diffusion of the metal component in the cathode 170.

The inorganic encapsulation film (also referred to as an "inorganic passivation film") 185, which may contact the capping layer 180, in the encapsulation structure 190, may be formed of $SiN_x$ or SiON, and the coefficient of thermal expansion thereof is $3.3 \times 10^{-6}$ m/K to $3.7 \times 10^{-6}$ m/K, which is lower than the coefficient of thermal expansion of the capping layer 180 formed of a metal fluoride. A color filter layer 210 may be further provided on the encapsulation structure 190 to correspond to each emission part E.

The opposite substrate 200 may be located at a position corresponding to a display surface, and may thus be referred to as a "cover layer," a "cover window," or a "cover film." In some cases, the cover layer may have an airgap with respect to at least a part of the encapsulation structure 190.

FIGS. 1 and 2 illustrate an example in which the substrate 100 is divided into the emission parts E and the transmission parts T. However, the display device according to the present disclosure may be applied to various other examples in addition to the illustrated example, in which the transmission parts T are provided to implement a transparent display device.

Figure 3:
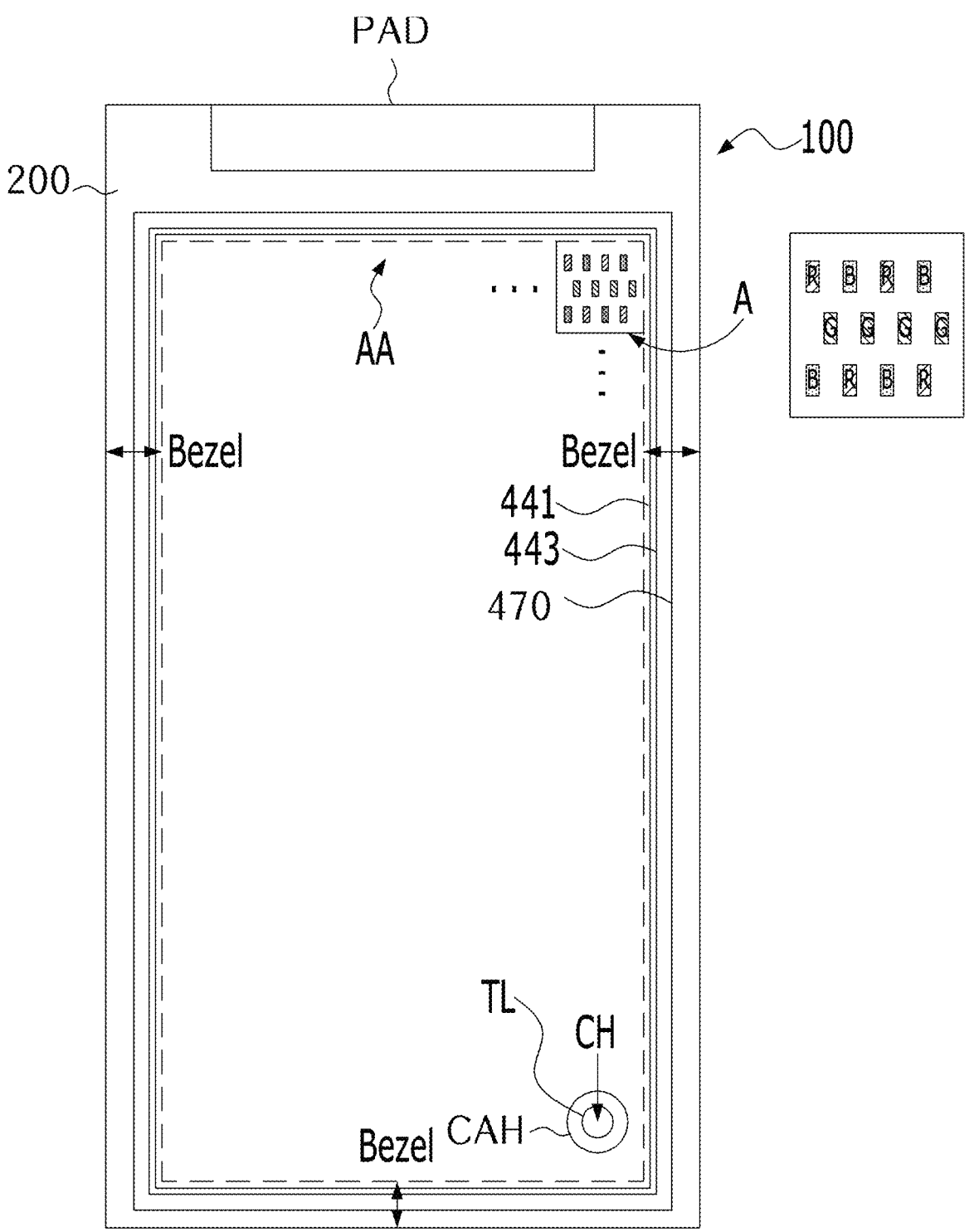
FIG. 3 is a plan view of a display device according to a second embodiment of the present disclosure.

FIG. 3 is a plan view of a display device according to a second embodiment of the present disclosure.

The display device according to the second embodiment of the present disclosure may include a substrate 100 having an active area AA, including a plurality of emission parts R, G, and B spaced apart from one another, and non-active areas Bezel provided outside the active area AA, and an opposite substrate 200 configured to cover the substrate 100, except for a pad part PAD. Although the example shown in FIG. 3 illustrates only the emission parts R, G, and B in the active area AA, the disclosure is not limited thereto. For example, the transmission parts T shown in FIGS. 1 and 2 may be further provided in the active area AA.

The display device according to the second embodiment of the present disclosure may have a structure in which a camera is provided under the substrate 100. In this case, to achieve visibility of light through a camera lens CL provided on the camera, a cathode 470, which may be transflective, may be patterned and removed from a region corresponding to the camera, as shown in the example of FIG. 3. In this case, the cathode 470, which may be formed in the entirety of the active area AA, and may extend to some parts of the non-active areas Bezel, may have a removal part formed in the shape of a hole CAH corresponding to the camera in the region corresponding to the camera.

Each of the emission parts R, G, and B may have an emission layer (not shown in FIG. 3), and may include first and second common layers 441 and 443 located on and under the emission layer, as described above with reference to FIG. 1. In FIG. 3, the first and second common layers 441 and 443 may be formed in the entirety of the active area AA, and may extend to some parts of the non-active areas Bezel. The first and second common layers 441 and 443 may be formed before formation of the cathode 470, and may be formed in the region corresponding to the hole CAH of the cathode 470.

Further, an electron injection layer and a capping layer may be formed using the same mask as the cathode 470. When the cathode 470 is patterned to form the shape of the hole CAH, the electron injection layer and the capping layer may also be removed from the region corresponding to the hole CAH.

Even in the display device according to the second embodiment, because the electron injection layer and the capping layer may contact a region in which the cathode 470 is formed, the capping layer may be formed of a material having a lower coefficient of thermal expansion than that of the cathode 470 to realize stability of the surface of the cathode 470 and high-temperature reliability when the cathode 470 is patterned. Also, the electron injection layer may be formed of an electron-injecting metal to facilitate electron injection.

Hereinafter, the relationships between a cathode and structures provided thereon will be described through tests.

Figure 4A:
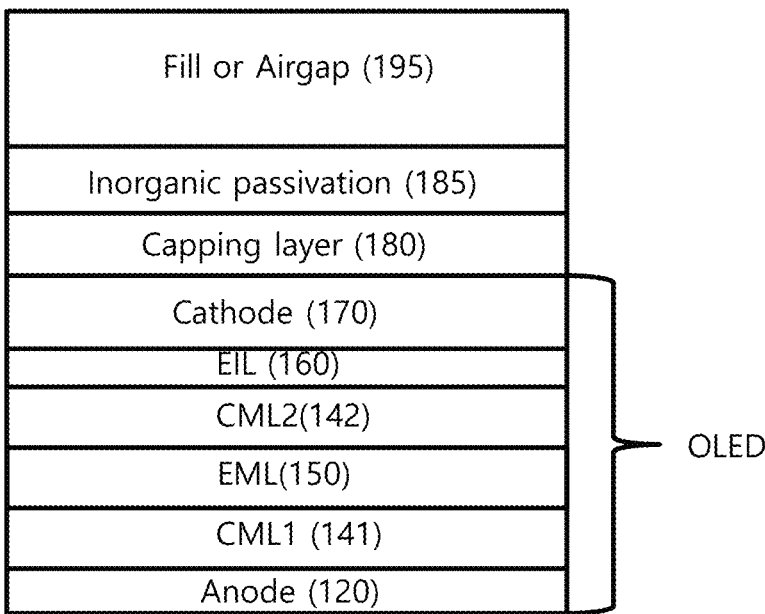
FIG. 4A is a longitudinal-sectional view illustrating a first region of a display device according to a third embodiment of the present disclosure.
Figure 4B:
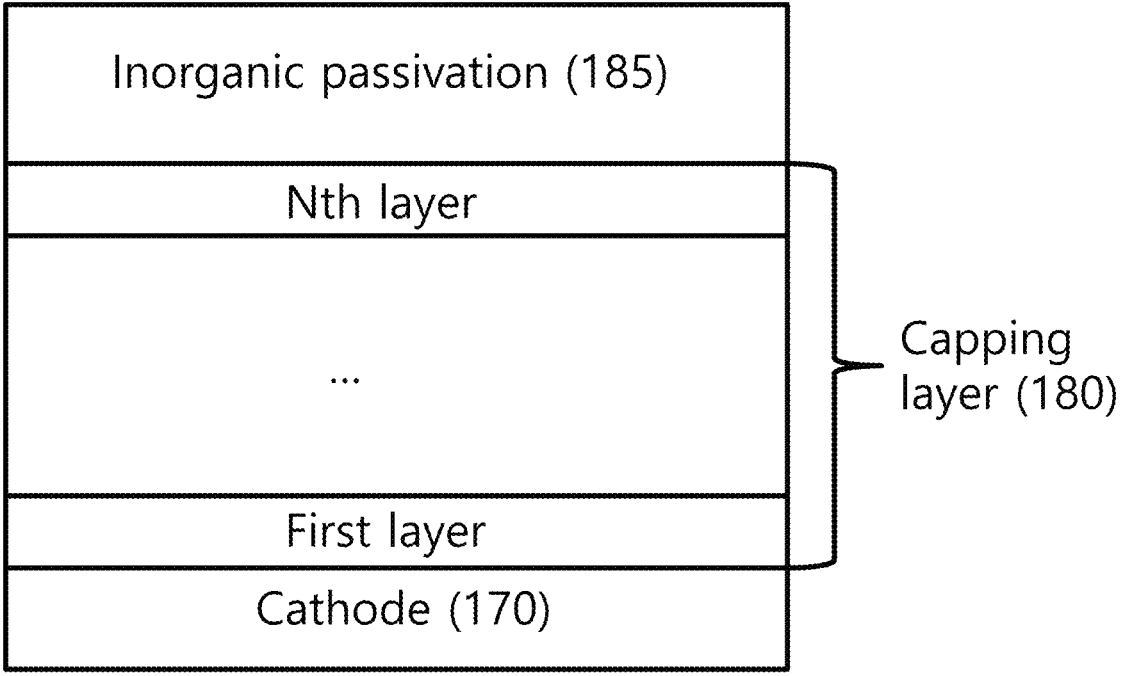
FIG. 4B is a longitudinal-sectional view illustrating elements provided on the upper surface of a cathode of a display device according to a fourth embodiment of the present disclosure.
Figure 5A:
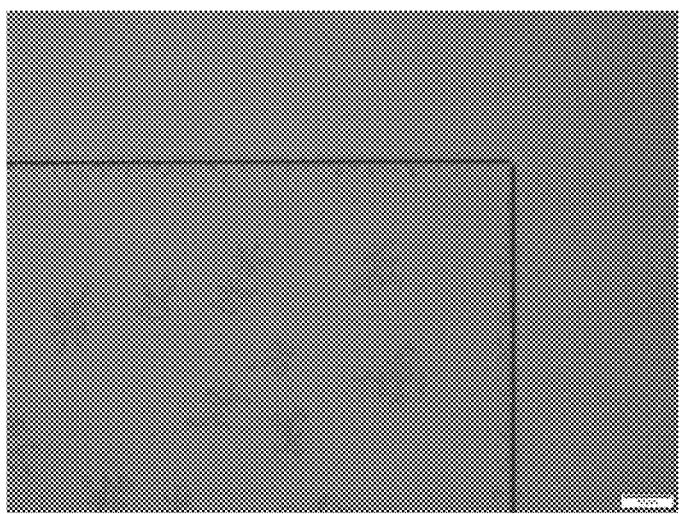
FIGS. 5A to 5D are optical microscope images illustrating deposited states of capping layers formed of respective materials according to Test Examples 1 to 4 Ex1, Ex2, Ex3 and Ex4, after deposition of the capping layers.
Figure 5B:
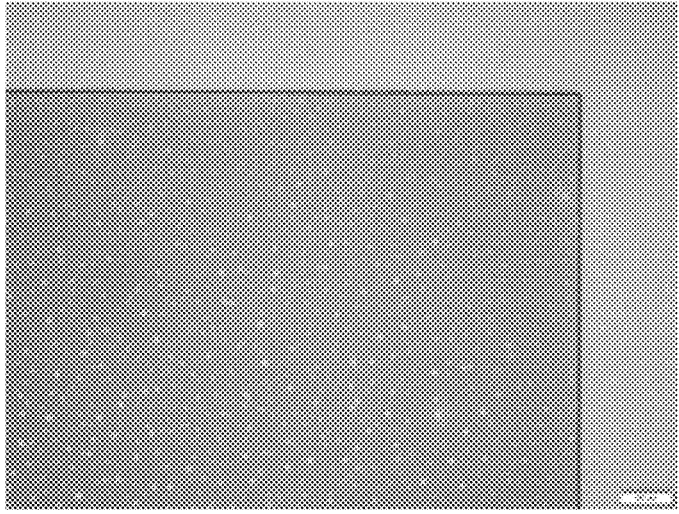
Figure 5C:
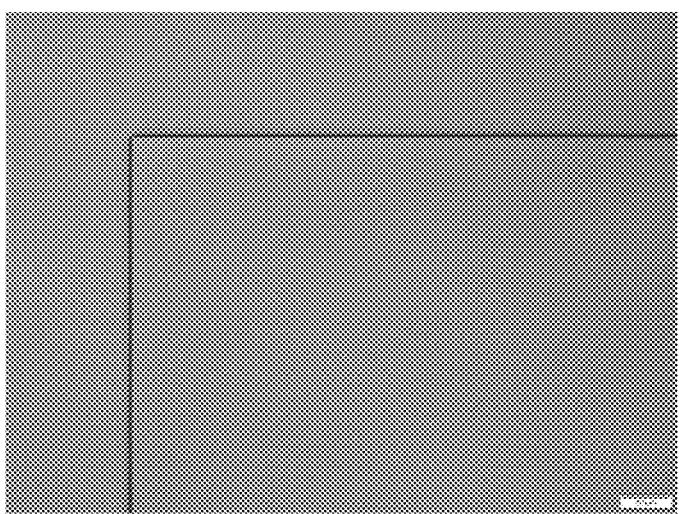
Figure 5D:
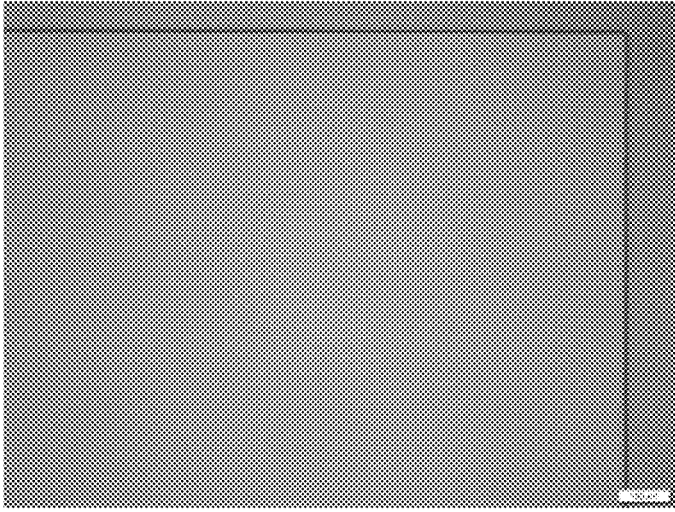

FIG. 4A is a longitudinal-sectional view illustrating a first region of a display device according to a third embodiment of the present disclosure. FIG. 4B is a longitudinal-sectional view illustrating elements provided on the upper surface of a cathode of a display device according to a fourth embodiment of the present disclosure.

FIG. 4A is a longitudinal-sectional view corresponding to the emission part or the first region E shown in FIGS. 1 and 3, and illustrates a light-emitting device OLED, and a capping layer 180, an inorganic passivation film 185, and a filler or an airgap 196, which may be sequentially located on the light-emitting device OLED.

The light-emitting device OLED may include an anode 120 and a cathode 170 disposed opposite each other. The light-emitting device OLED may further include a first common layer 141, an emission layer 150, a second common layer 142, and an electron injection layer 160, which may be provided between the anode 120 and the cathode 170.

In terms of thermal expansion when a high temperature is applied, the electron injection layer 160 may have a very small thickness, less than or equal to 50 Å, and may scarcely influence thermal expansion. Therefore, in terms of changes in the coefficients of thermal expansion of the respective layers provided on the anode 120, all the organic layers 141, 150, and 142 between the anode 120 and the cathode 170 may exhibit the first coefficient of thermal expansion CTE1 higher than or equal to $100 \times 10^{-6}$ m/K, which is highest, and the second coefficient of thermal expansion CTE2 of the cathode 170, the third coefficient of thermal expansion CTE3 of the capping layer 180, the fourth coefficient of thermal expansion CTE4 of the inorganic passivation film 185, and the fifth coefficient of thermal expansion CTE5 of the filler or the airgap 195 are decreased in order. For example, the second coefficient of thermal expansion CTE2 of the cathode 170 formed of magnesium (Mg) is $26 \times 10^{-6}$ m/K, and the third coefficient of thermal expansion CTE3 of the capping layer 180 formed of a metal fluoride is less than or equal to $20 \times 10^{-6}$ m/K. Further, the coefficient of thermal expansion of a silicon nitride ($SiN_x$) film used as the inorganic passivation film 185 is $3.7 \times 10^{-6}$ m/K, the coefficient of thermal expansion of a silicon oxynitride (SiON) film used as the inorganic passivation film 185 is $3.3 \times 10_{-6}$ m/K, the coefficient of thermal expansion of the filler is $1 \times 10^{-6}$ m/K, the coefficient of thermal expansion of the airgap 195 is 0 m/K. Thus, the coefficients of thermal expansion of the respective layers may satisfy the above-described sequential decrease in coefficients of thermal expansion in the upward direction of the light-emitting device OLED shown in FIG. 4A.

That is, in the display device according to the third embodiment of the present disclosure shown in FIG. 4A, the capping layer 180 may be formed of a material having a lower coefficient of thermal expansion than that of the cathode 170. Thus, the capping layer 180 may have a compressive force in the opposite direction to the tensile direction of the cathode 170, even in the environment in which the cathode 170 is tensioned, for example, at a high temperature, thereby being capable of reducing or preventing migration of a single metal component forming the cathode 170. Therefore, the capping layer 180 may restrict migration of the metal component forming cathode 170 to reduce the diffusion distance of the metal component, thus being capable of reducing or preventing a display defect, such as the sand grain effect.

The capping layer 180 may be formed of a metal fluoride having a lower coefficient of thermal expansion than that of the metal forming the cathode 170. A metal included in the metal fluoride may be, for example, an alkaline-earth metal or a transition metal. $MgF_2$ or the like may be used as an alkaline-earth metal fluoride, and $YbF_3$ or the like may be used as a transition metal fluoride. The coefficient of thermal expansion of $MgF_2$ is lower than or equal to $10 \times 10^{-6}$ m/K, and the coefficient of thermal expansion of $YbF_3$ is $8.5 \times 10^{-6}$ tensile stress. As such, among the capping layers 180, the inner capping layer 180 may include an organic capping material to maintain optical properties, the capping layer 180 disposed to contact the cathode 170 may include a metal fluoride to reduce or prevent diffusion of the metal component of the cathode 170 and thus to minimize occurrence of tensile force, and the capping layer 180 disposed farthest away from the cathode 170 may include another metal fluoride to reduce or prevent tension of the capping layer structure and thus to minimize a change in the capping layers 180 due to tensioning thereof.

That is, in the third and fourth embodiments of the present disclosure, the cathode 170 and the capping layer 180 may be configured such that the coefficients of thermal expansion thereof are decreased in the upward direction. Thus, the capping layer 180 may have compressive force in the opposite direction to the tensile direction of the cathode 170 when the cathode 170 is tensioned, thereby reducing or preventing the cathode 170 from being tensioned, and reducing or preventing migration of the metal component forming the cathode 170 and the sand grain effect caused by diffusion of the metal component.

Hereinafter, surface properties of capping layers formed of respective materials and high-temperature reliabilities thereof will be examined through Test Examples 1 to 4.

FIGS. 5A to 5D are optical microscope images illustrating deposited states of capping layers formed of respective materials according to Test Examples 1 to 4 Ex1, Ex2, Ex3 and Ex4, after deposition of the capping layers.

TABLE 1

| Classification | Storage time (H) | Driving voltage (V) | Voltage change ($\Delta V$) | Efficiency (Cd/A) | CIEx | CIEy | Wavelength (nm) |
|---|---|---|---|---|---|---|---|
| EX1 | 0 | 7.2 | | 158.6 | 0.268 | 0.690 | 526 |
| | 300 | 7.4 | +0.2 | 148.4 | 0.272 | 0.681 | 524 |
| | 500 | 8.3 | +1.1 | 143.3 | 0.274 | 0.678 | 524 |
| EX2 | 0 | 7.2 | | 186.8 | 0.252 | 0.704 | 526 |
| | 300 | 7.8 | +0.6 | 180.0 | 0.257 | 0.698 | 526 |
| | 500 | 8.0 | +0.8 | 174.6 | 0.258 | 0.698 | 526 |
| EX3 | 0 | 7.2 | | 136.5 | 0.305 | 0.669 | 542 |
| | 300 | 7.3 | +0.1 | 132.5 | 0.308 | 0.666 | 536 |
| | 500 | 7.3 | +0.1 | 130.3 | 0.308 | 0.665 | 536 |
| EX4 | 0 | 7.1 | | 154.7 | 0.280 | 0.687 | 532 |
| | 300 | 7.2 | +0.1 | 152.3 | 0.283 | 0.685 | 532 |
| | 500 | 7.3 | +0.2 | 151.7 | 0.283 | 0.684 | 532 | m/K. In the display device according to the present disclosure, the capping layer 180 may be formed of a material having a lower coefficient of thermal expansion than that of the material of the cathode 170, thereby being capable of reducing or preventing the sand grain effect caused by tensile stress at a high temperature. As shown in the example of FIG. 4B, in the display device according to the fourth embodiment of the present disclosure, when a plurality of capping layers 180, such as first to $N^{th}$ capping layers 180, is provided, the first capping layer 180 disposed to contact the cathode 170 and the $N^{th}$ capping layer 180 disposed farthest away from the cathode 170 may include different metal fluorides.

Further, an organic capping layer 180 having a higher coefficient of thermal expansion than those of metal fluorides may be provided between the first capping layer 180 and the $N^{th}$ capping layer 180. In a structure including a plurality of capping layers 180, matching between of the coefficients of thermal expansion of the uppermost capping layer 180 and the lowermost capping layer 180 influences With reference to Table 1 and FIGS. 5A to 5D, the structure shown in FIGS. 1 and 2 was applied, and display devices, in which the cathode 170 formed of a single metal, e.g., magnesium (Mg), was used in common and the capping layers 180 respectively formed of an organic material LCP80, lithium fluoride (LiF), $MgF_2$, and $YbF_3$ are used in Test Examples 1 to 4 Ex1, Ex2, Ex3, and Ex4, were tested. After the respective display devices were stored at a high temperature of 100° C. for 0 hours, 300 hours, and 500 hours, driving voltages of the display devices were measured, voltage changes between the driving voltages and the initial voltages thereof were calculated, and efficiencies, color coordinates and emission peak values $\lambda_{max}$ of the respective display devices were measured. Measurement was performed in a state in which green light is emitted. For reference, the coefficient of thermal expansion of the organic material LCP80 used in Test Example 1 Ex1 was higher than or equal to $100 \times 10^{-6}$ m/K, the coefficient of thermal expansion of LiF used in Test Example 2 Ex2 was $37 \times 10^{-6}$ m/K, and both coefficients of thermal expansion were higher than the coefficient of thermal expansion of magnesium (Mg) forming the cathode 170, e.g., $26 \times 10^{-6}$ m/K.

The coefficient of thermal expansion of $MgF_2$ used in Test Example 3 Ex3 wa lower than or equal to $10 \times 10^{-6}$ m/K, the coefficient of thermal expansion of $YbF_3$ used in Test Example 4 Ex4 was $8.5 \times 10^{-6}$ m/K, and both coefficients of thermal expansion were lower than the coefficient of thermal expansion of magnesium (Mg) forming the cathode 170, e.g., $26 \times 10^{-6}$ m/K.

The results of Test Examples 1 to 4 Ex1, Ex2, Ex3, and Ex4 after high-temperature storage show that the driving voltages of the display devices according to Test Examples 1 and 2 Ex1 and Ex2 were raised by 1.1 V and 0.8 V, respectively, after high-temperature storage for 500 hours. On the other hand, the driving voltages of the display devices according to Test Examples 3 and 4 Ex3 and Ex4 were raised by within 0.2 V after high-temperature storage for 500 hours. As such, it may be confirmed that there were little changes in the driving voltages of the display devices at a high temperature and little changes in efficiency and color coordinates of the display devices, and thus high-temperature reliability may be secured.

Further, as shown in FIGS. 5A to 5D, the results of observation through an optical microscope of the deposited states of the capping layers 180 according to Test Examples 1 to 4 Ex1, Ex2, Ex3 and Ex4, after 500 hours had elapsed show that the sand grain effect occurred on the display devices of Test Examples 1 and 2 Ex1 and Ex2, but the display devices of Test Examples 3 and 4 Ex3 and Ex4 had stable surface properties without any defect. That is, in the display device according to the present disclosure, when the cathode which is to be patterned is formed of a single metal, the capping layer may be formed of a material having a lower coefficient of thermal expansion than that of the single metal, for example, a metal fluoride, as in above Test Example 3 or 4 Ex3 or Ex4, thereby being capable of increasing the interfacial stability on the surface of the cathode, and thus securing high-temperature reliability.

In this case, the metal fluoride may use an alkaline-earth metal, such as magnesium (Mg), or a transition metal, such as ytterbium (Yb). Further, the display device according to the present disclosure may include a plurality of capping layers 180. When a plurality of capping layers 180 is provided, the capping layers may be configured such that the coefficients of thermal expansion of the respective capping layers 180 are decreased in a direction away from the cathode 170.

Hereinafter, transmittances of the display devices according to respective Test Examples, depending on application of an encapsulation structure thereto, will be examined.

Figure 6A:
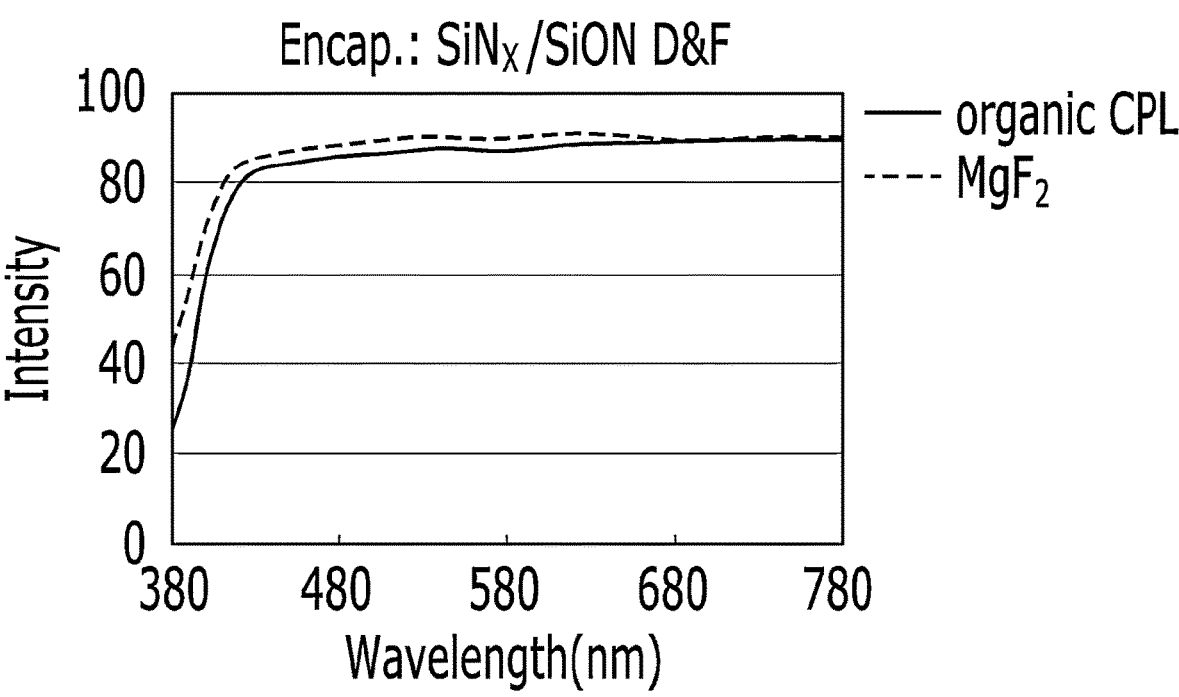
FIG. 6A is a graph representing transmittances of the display devices according to Test Examples 1 and 3 Ex1 and Ex3 after application of an encapsulation layer structure thereto.
Figure 6B:
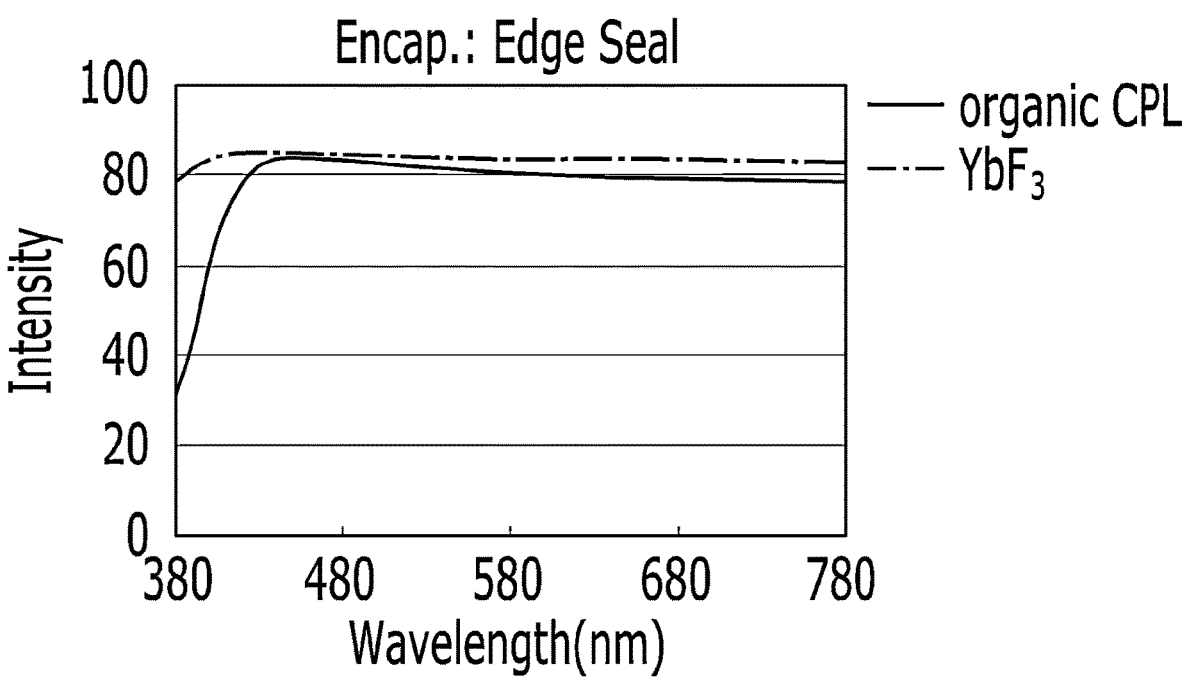
FIG. 6B is a graph representing transmittances of the display devices according to Test Examples 1 and 4 Ex1 and Ex4 after application of an edge seal thereto.

FIG. 6A is a graph representing transmittances of the display devices according to Test Examples 1 and 3 Ex1 and Ex3 after application of the encapsulation layer structure thereto. FIG. 6B is a graph representing transmittances of the display devices according to Test Examples 1 and 4 Ex1 and Ex4 after application of an edge seal thereto.

FIG. 6A shows the transmittances of the display device according to Test Example 1 Ex1 in which the capping layer 180 was formed of the organic capping material, and the display device according to Test Example 3 Ex3 in which the capping layer 180 was formed of $MgF_2$, after the inorganic passivation film 185 formed of $SiN_x$ or SiON was applied to the surface of the capping layer 180 and then the filler 195 was provided thereon, like the structure shown in FIG. 4A. In this case, the transmittances of the display devices depending on wavelength were measured.

The inorganic passivation film 185 formed of $SiN_x$ or SiON, located at the closest position to the capping layer 180, had a coefficient of thermal expansion of about $3-4 \times 10^{-6}$ m/K. In Test Example 3 Ex3, having the configuration of the display device according to the present disclosure, the coefficients of thermal expansion of the cathode 170, the capping layer 180, and the inorganic passivation film 185 were decreased in order, and may thus reduce or prevent migration of the metal component of the cathode 170 of the display device, and thereby promote high-temperature reliability thereof. In contrast, in Test Example 1 Ex1, in which the coefficient of thermal expansion of the capping layer 180 was higher than that of the cathode 170, different transmittance characteristics were exhibited. That is, as shown in FIG. 6A, the display device according to Test Example 3 Ex3 had excellent transmittance throughout the visible spectrum, compared to the display device according to Test Example 1 Ex1.

FIG. 6B shows the transmittances of the display device according to Test Example 1 Ex1 and the display device according to Test Example 4 Ex4, in which, after the inorganic passivation film 185 formed of $SiN_x$ or SiON was applied to the surface of the capping layer 180, the edge seal was applied to the edge of the substrate 100, and the opposite substrate 200 was bonded to the substrate 100 by the edge seal. In this case, a filler or an airgap may be provided on the inorganic passivation film 185 as circumstances dictate.

In this case, the capping layer 180 was formed of the organic capping material in Test Example 1 Ex1, the capping layer 180 was formed of $MgF_2$ in Test Example 4 Ex4, and the transmittances of the display devices according to Test Examples 1 and 4 Ex1 and Ex4, depending on wavelength, were measured. As shown in FIG. 6B, the display device according to Test Example 4 Ex4 had excellent transmittance throughout the visible spectrum, compared to the display device according to Test Example 1 Ex1.

The above test results indicate that a capping layer formed of a metal fluoride not only may secure high-temperature reliability but also may exhibit excellent transmittance, compared to a capping layer formed of an organic material. In the display device according to one embodiment of the present disclosure, the capping layer formed of a material having a low coefficient of thermal expansion, for example, a metal fluoride, as in above Test Example 3 or 4, may be provided on the cathode formed of a single metal, thereby being capable of maintaining excellent interfacial properties on the upper surface of the cathode and securing high-temperature reliability.

Hereinafter, the characteristics of the cathode according to the present disclosure will be examined in connection with elements provided under the cathode.

Figure 7A:
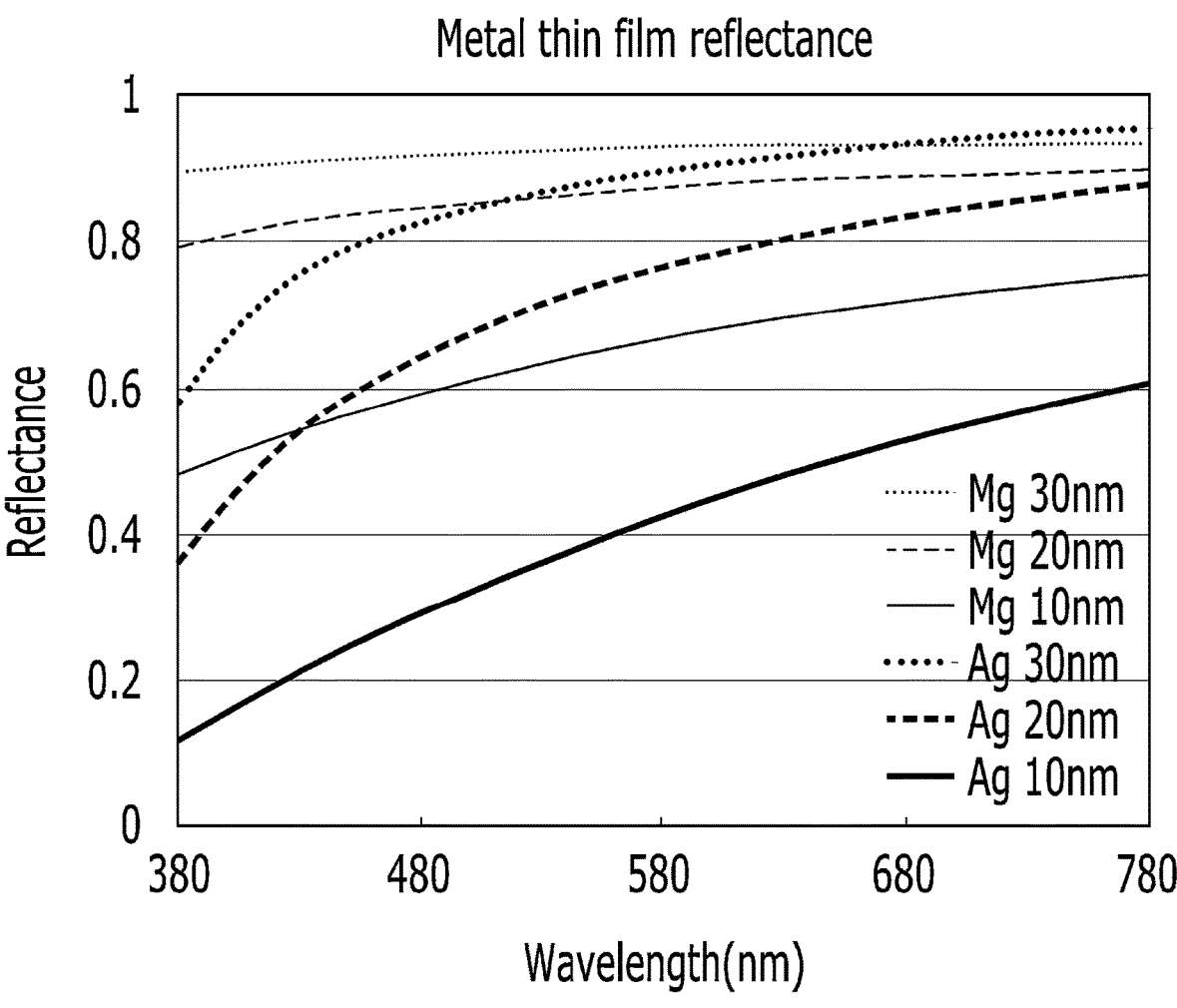
FIG. 7A is a graph representing reflectances of Ag and Mg depending on thickness thereof.
Figure 7B:
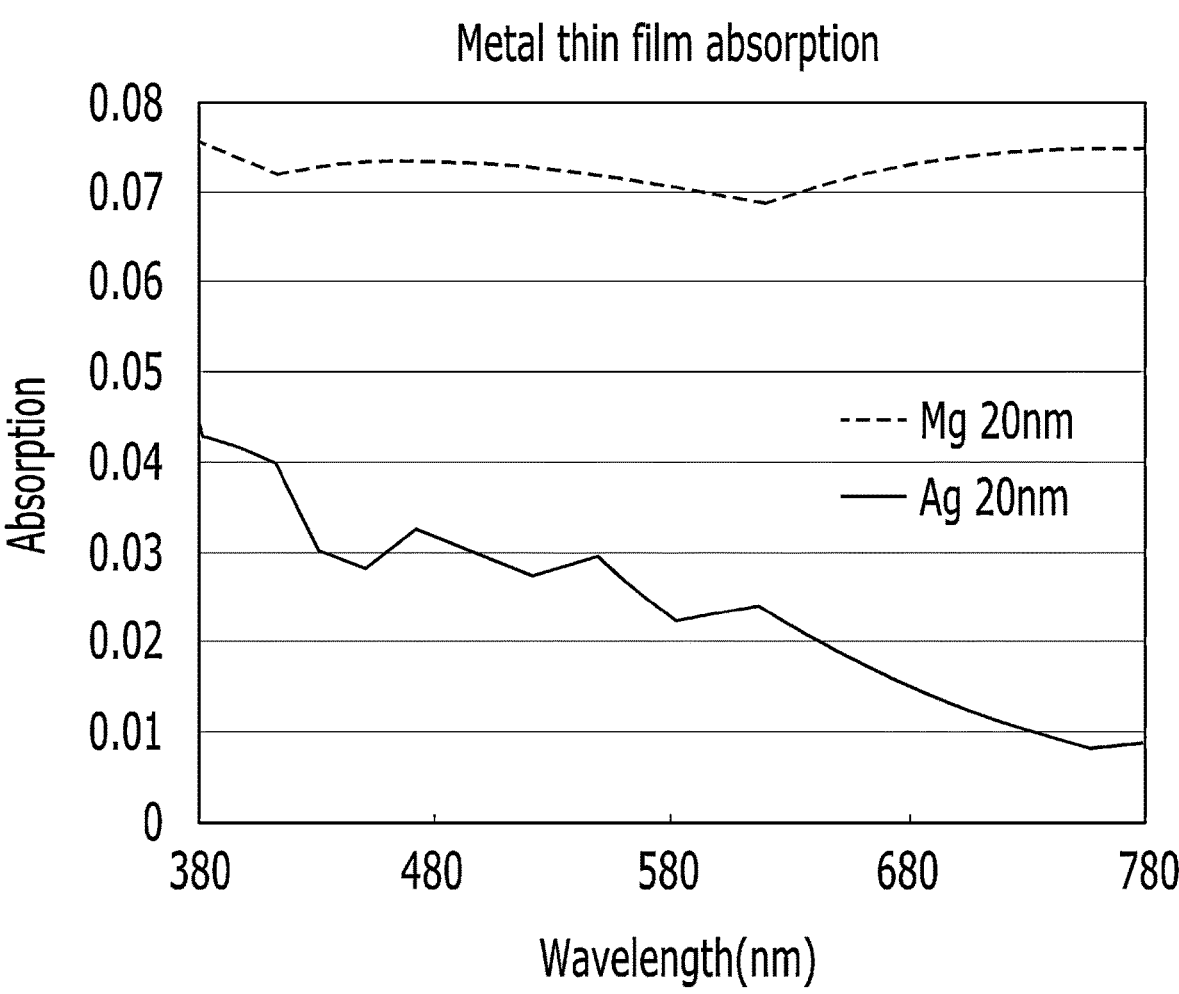
FIG. 7B is a graph representing absorptances of Ag and Mg depending on wavelength.

FIG. 7A is a graph representing reflectances of Ag and Mg depending on thickness thereof. FIG. 7B is a graph representing absorptances of Ag and Mg depending on wavelength.

The cathode according to the present disclosure should be repeatedly reflective on the surface thereof to realize resonance of light in the light-emitting device, and should further be transmissive to serve as an exit electrode. For example, Ag and Mg are examined as transflective metals.

As shown in FIG. 7A, as the thicknesses of both Ag and Mg films were increased, the reflectances of the Ag and Ma films were increased. However, the reflectance of the Ag film was lower than the reflectance of the Mg film at the same thickness. As shown in FIG. 7B, as results of the absorptances of the Ag film and the Mg film having the same thin thickness of 20 nm, the absorptance of the Mg film was higher than the absorptance of the Ag film at full wavelengths.

As shown in FIGS. 7A and 7B, because Mg has a shorter optical penetration depth and higher absorptance than Ag, the reflectance and absorptance of Mg were much higher than those of Ag when the thicknesses of the Mg film and the Ag film were increased to 20 nm or more. Therefore, when the cathode is formed of a material a low work function, such as Mg having a work function of 4 eV, the cathode formed of Mg may have a thickness of less than 20 nm to reduce or prevent excessive surface reflection and absorption, and to secure a designated level of efficiency and a designated viewing angle. For example, when the cathode is formed of magnesium as a single component, the cathode may have a thickness of 5 nm to 14 nm (50 Å-140 Å), and more particularly may have a thickness of 5 nm to 10 nm. That is, in the display device according to the present disclosure, when the cathode is formed of a single metal having a low work function, such as Mg, the cathode may essentially require a small thickness to perform optical functions.

Hereinafter, improvement of reliability and high-temperature reliability by application of a thin cathode will be examined.

FIG. 8A to 8D are optical microscope images of display devices according to Test Examples 5 and 6 Ex5 and Ex6 after 500 hours at a high temperature have elapsed after formation of cathodes and after 500 hours at a high temperature have elapsed after formation of capping layers. FIGS. 9A and 9B are TEM images of the display device according to Test Example 6 Ex6 after 0 hours and 300 hours have elapsed after formation of the capping layer.

In Test Example 5 Ex5, an electron injection layer was formed of Yb to have a thickness of 20 Å, and a cathode was formed of Mg to have a thickness of 100 Å. In Test Example 6 Ex6, an electron injection layer was formed of Yb to have a thickness of 40 Å, and a cathode was formed of Mg to have a thickness of 100 Å.

Figure 8A:
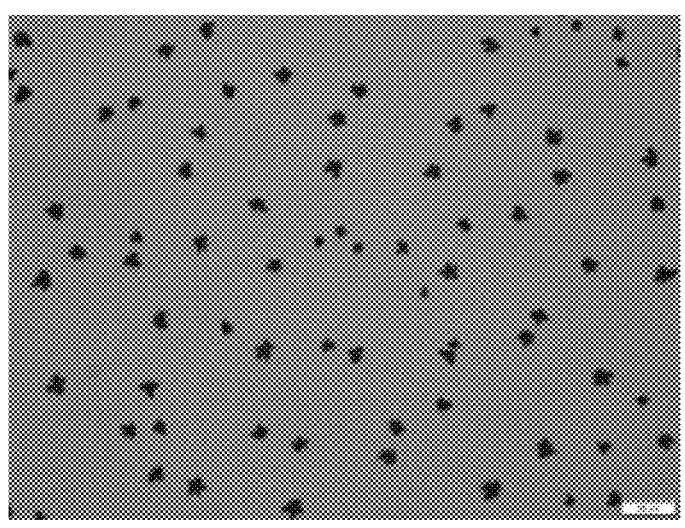
FIGS. 8A to 8D are optical microscope images of display devices according to Test Examples 5 and 6 Ex5 and Ex6 after 500 hours at a high temperature have elapsed after formation of cathodes and after 500 hours at a high temperature have elapsed after formation of capping layers.
Figure 8B:
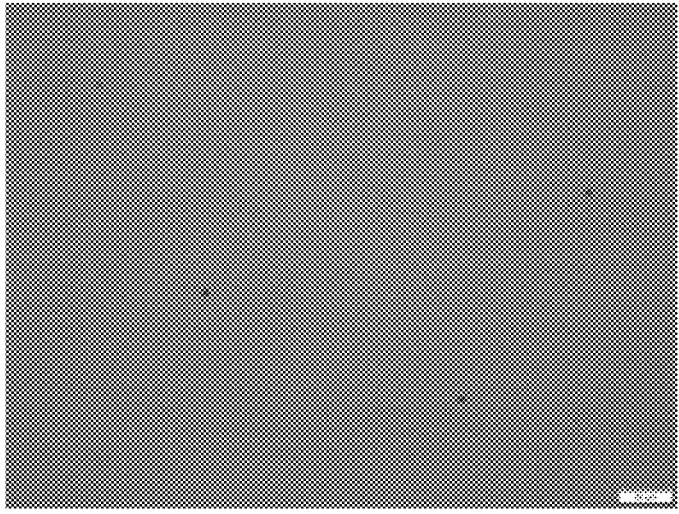
Figure 8C:
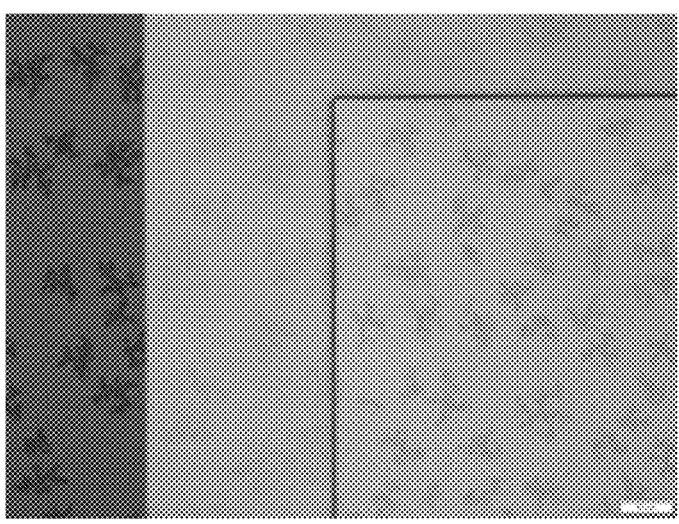
Figure 8D:
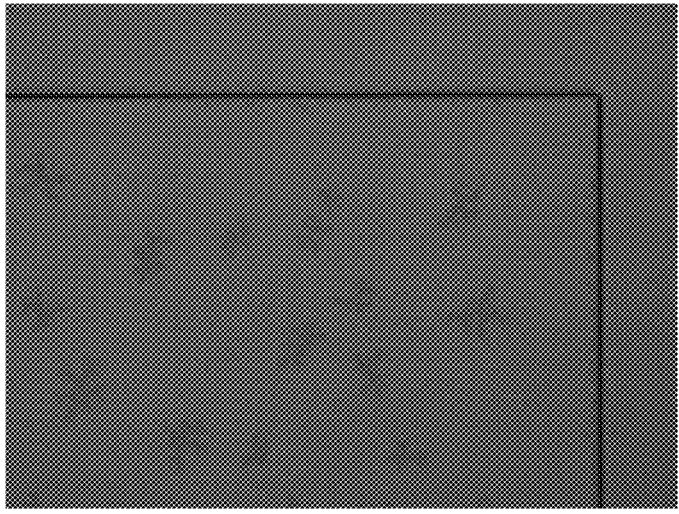
Figure 9A:
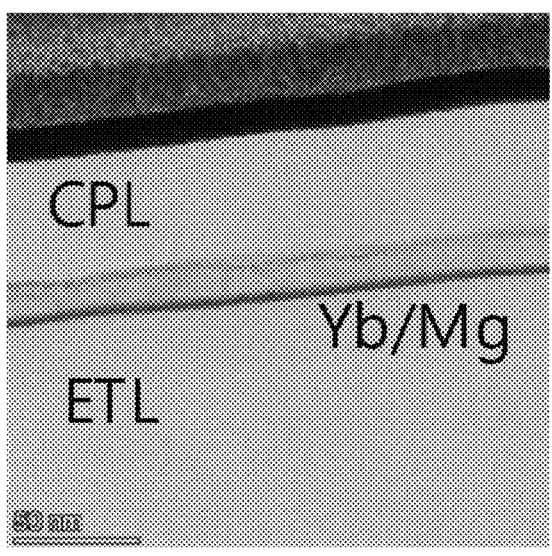
FIGS. 9A and 9B are TEM images of the display device according to Test Example 6 Ex6 after 0 hours and 300 hours have elapsed after formation of the capping layer.
Figure 9B:
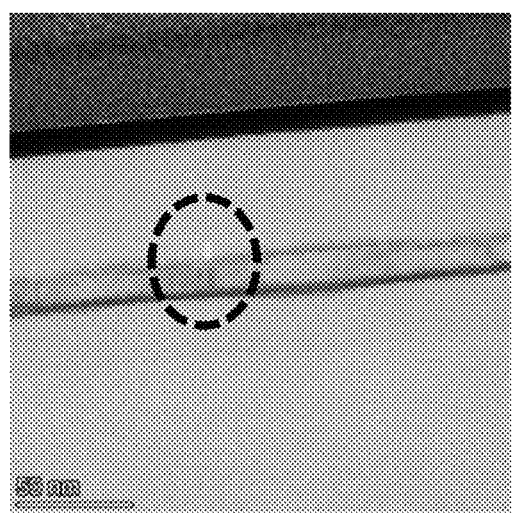

FIGS. 8A to 8D show the states of the display devices according to Test Examples 5 and 6 Ex5 and Ex6 after 500 hours at a high temperature of 100° C. have elapsed. In comparison between Test Examples 5 and 6 Ex5 and Ex6, it may be confirmed that, after 500 hours at a high temperature of 100° C. have elapsed after formation the cathodes on the electron injection layers, crystallinity in the display device according to Example 6 Ex5 and Ex6 was relatively reduced, as shown in FIGS. 8A and 8B. Also, after 500 hours at a high temperature of 100° C. have elapsed after formation the capping layer (formed of an organic capping material), the display devices according to Test Examples 5 and 6 Ex5 and Ex6 exhibited the sand grain effect, as shown in FIGS. 8C and 8D.

FIGS. 9A and 9B are the images of the display device according to Test Example 6 Ex6, which were acquired by a transmission electrode microscopy (TEM) instrument, after 0 hours and 300 hours have elapsed after formation of the capping layer. Here, the capping layer was formed of the organic capping material.

The display device according to Test Example 6 Ex6 was stable in the initial state thereof, as shown in FIG. 9A. However, when a designated time had elapsed, metal atoms were rearranged due to migration thereof in the cathode formed of Mg, moved in a direction of decreasing a defect caused by unstable surface properties with the electron injection layer formed of Yb and inner pores to form new grains, and were partially recrystallized, as shown in FIG. 9B, thereby causing the sand grain effect.

Considering that the sand grain effect occurs at the interface between the electron injection layer and the cathode when the display device is stored at a high temperature, the inventors of the present disclosure examined changes in the configuration of the electron injection layer.

Figure 10:
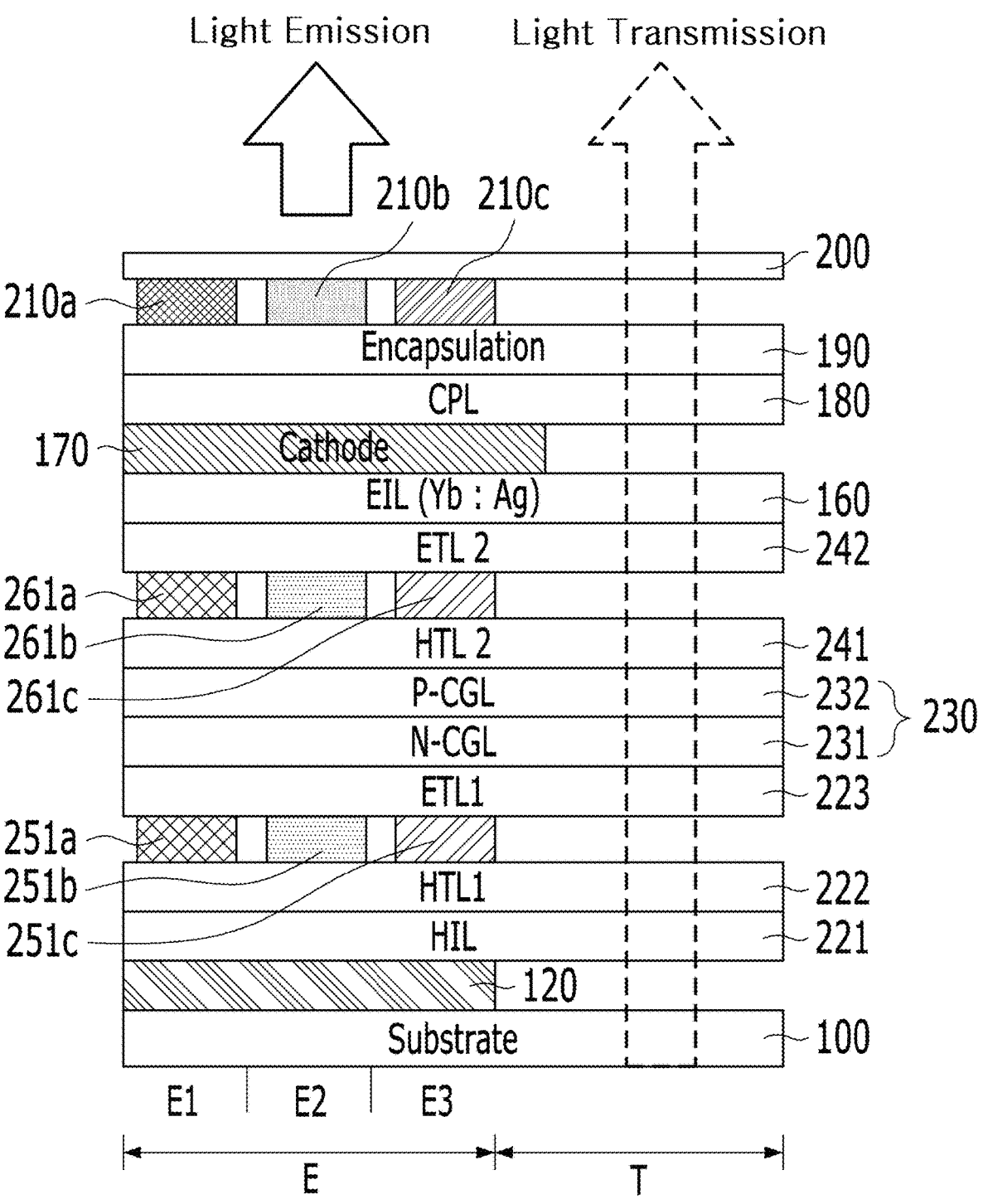
FIG. 10 is a longitudinal-sectional view of a display device according to a fifth embodiment of the present disclosure.

FIG. 10 is a longitudinal-sectional view of a display device according to a fifth embodiment of the present disclosure.

The display device according to the fifth embodiment of the present disclosure shown in FIG. 10 differs from the above-described display device according to the first embodiment in that an electron injection layer 160 further includes a second metal having a surface energy greater than or equal to 1 J/m$^2$ in addition to a first metal, which has an electron-injecting property. Furthermore, although FIG. 10 illustrates that two organic stacks may be provided between an anode 120 and a cathode 170, the display device according to the present disclosure is not limited thereto. For example, a single organic stack or three or more organic stacks may be provided therebetween.

When a plurality of organic stacks is provided between the anode 120 and the cathode 70, the respective organic stacks may be divided from each other by charge generation layers 230. The charge generation layers 230 may include an n-type charge generation layer 231 and a p-type charge generation layer 232. In some cases, a single charge generation layer including both an n-type dopant and a p-type dopant may be formed.

A substrate 100 may be divided into first to third emission parts E: E1, E2, and E3 configured to emit light with different colors, and transmission parts T configured to transmit light, emitted downwards to the substrate 100, upwards. Each of the first to third emission parts E: E1, E2, and E3 may include emission layers 251a and 261a, 251b and 261b, or 251c and 261c, provided in respective organic stacks to emit light with the same color, first and second hole transport layers 222 and 241 provided under the respective emission layers 251a and 261a, 251b and 261b, or 251c and 261c as common layers, and may include first and second electron transport layers 223 and 242 provided on the respective emission layers 251a and 261a, 251b and 261b, or 251c and 261c as common layers. Furthermore, a hole injection layer 221 for hole injection may be further provided between the anode 120 and the first hole transport layer 222.

A capping layer 180 and an encapsulation structure 190 may be provided on the cathode 170. Color filter layers 210a, 210b, and 210c, disposed opposite the encapsulation structure 190, may be provided on a cover layer 200 or an opposite substrate. The color filter layers 210a, 210b, and 210c may transmit respective wavelengths of light emitted by the first to third emission parts E1, E2, and E3, and may be substituted for polarizing plates.

Figure 11:
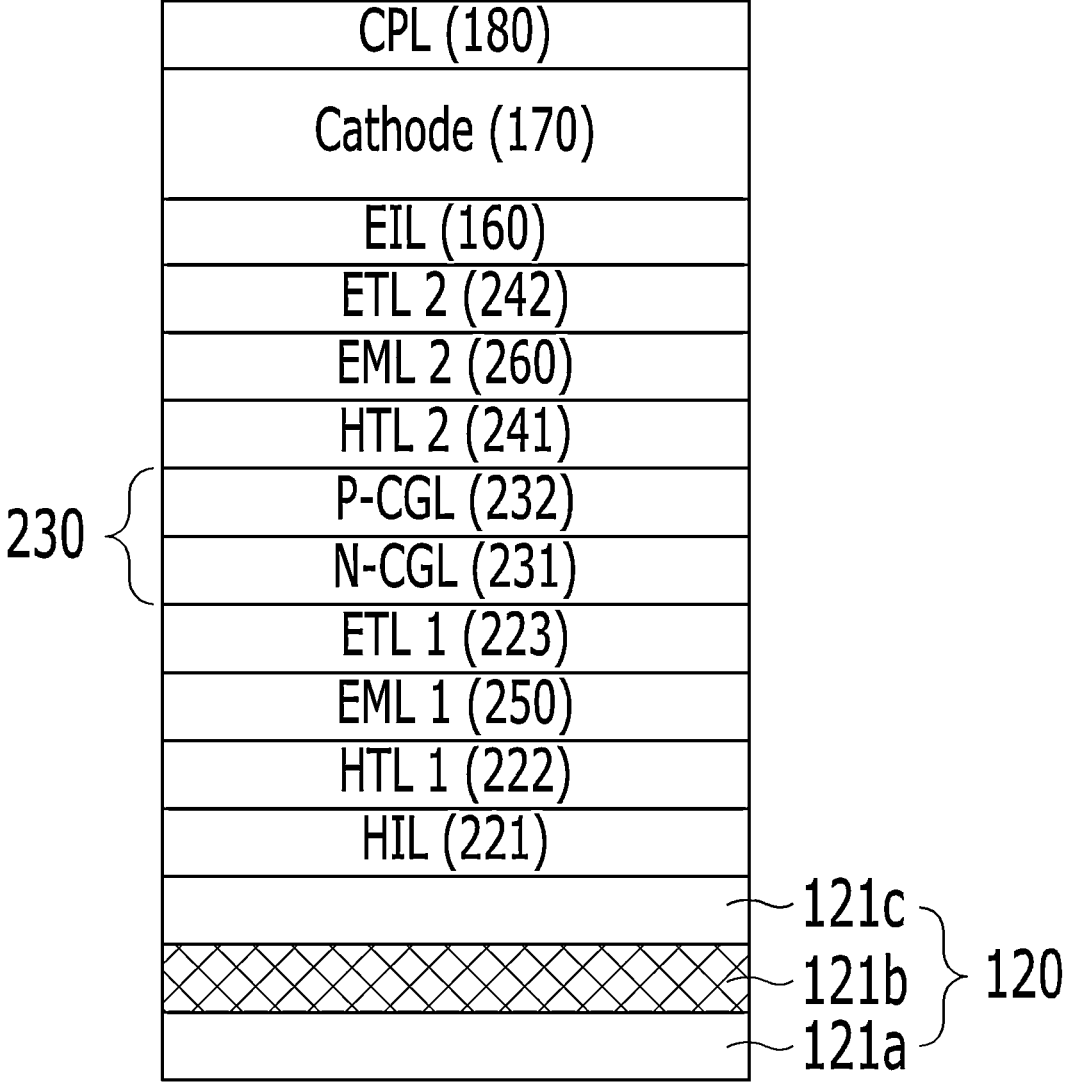
FIG. 11 is a longitudinal-sectional view illustrating the structure of each light-emitting device according to the fifth embodiment of the present disclosure.

FIG. 11 is a longitudinal-sectional view illustrating the structure of each light-emitting device according to the fifth embodiment of the present disclosure.

FIG. 11 illustrates the structure of the light-emitting device from the anode 120 to the capping layer 180, which was provided in the emission part (first region) to implement Test Examples 5 to 8. The anode 120 may have a three-layer structure, including a reflective electrode 121b and first and second transparent electrode layers 121a and 121c provided under and on the reflective electrode 121b. The anode 120, which may be a stack formed by sequentially stacking the first transparent electrode layer 121a, the reflective electrode 121b, and the second transparent electrode layer 121c, may function as the anode of the light-emitting device.

The second transparent electrode layer 121c may lower interfacial resistance with the hole injection layer 221 formed of an organic material. The first transparent electrode layer 121a may improve contact with a thin-film transistor provided thereunder.

The emission layers 250 and 260 of the respective organic stacks, divided from each other by the charge generation layers 231 and 232, may emit light with the same color. The respective layers from the hole injection layer 221 to the capping layer 180 have been described above with reference to FIG. 10, and a detailed description thereof will thus be omitted.

In the following tests, electron injection layers were formed of a single electron-injecting metal, e.g., Yb, in Test Examples 5 and 6 Ex5 and Ex6 and Modified Examples thereof, and electron injection layers were formed of an alloy including Yb and Ag having a surface energy greater than 1 J/m² in Test Examples 7 and 8 Ex7 and Ex8 and Modified Examples thereof. In this case, cathodes were formed of magnesium (Mg). The following tests were performed in a state in which the light-emitting devices were driven to emit green light or blue light.

Figure 12A:
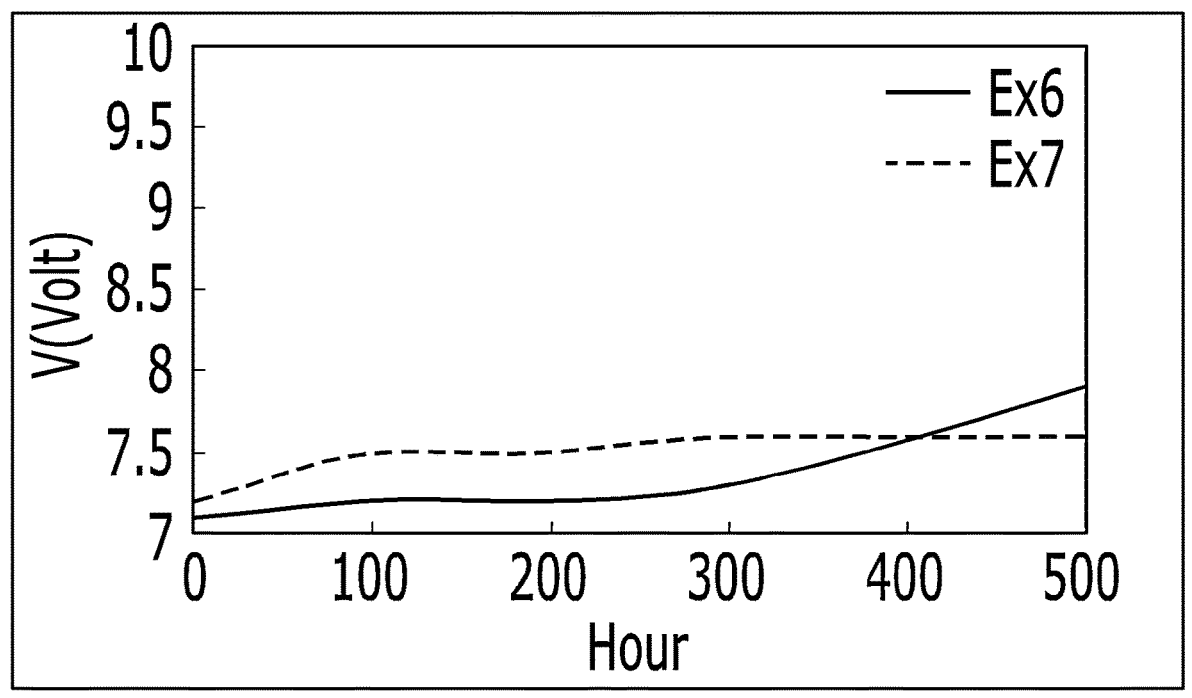
FIGS. 12A and 12B are graphs representing changes in driving voltage and changes in efficiency of display devices according to Test Example 6 Ex6 and Test Example 7 Ex7 over time when green light is emitted.
Figure 12B:
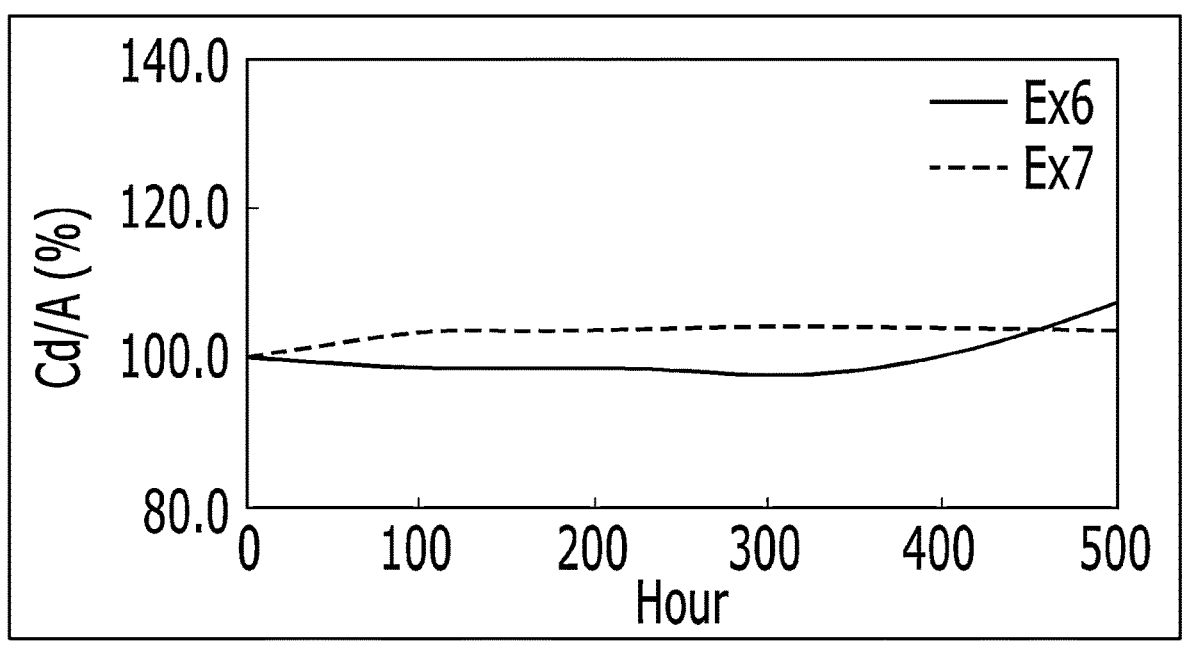

FIGS. 12A and 12B are graphs representing changes in driving voltage and changes in efficiency of display devices according to Test Example 6 Ex6 and Test Example 7 Ex7 over time when green light is emitted.

TABLE 2

| Classification | Optical characteristics (after 0 hours at 100° C.) | | | | Optical characteristics (after 500 hours at 100° C.) | | | | |
| | Driving voltage (V) | Efficiency (%) | CIEx | CIEy | Driving voltage (V) | Efficiency (%) | CIEx | CIEy | $\lambda_{max}$ (nm) |
| --- | --- | --- | --- | --- | --- | --- | --- | --- | --- |
| Ex6 | 7.1 | 100 | 0.276 | 0.690 | 7.9 | 107 | 0.286 | 0.679 | 530 |
| Ex7 | 7.2 | 100 | 0.270 | 0.690 | 7.6 | 103 | 0.272 | 0.686 | 528 |

In Test Example 6 Ex6, the electron injection layer was formed of Yb, which is an electron-injecting metal, to have a thickness of 40 Å, and the cathode was formed of Mg to have a thickness of 100 Å. In Test Example 7 Ex7, the electron injection layer was formed of an alloy including Yb and Ag having a surface energy greater than 1 J/m² to have a thickness of 40 Å, and the cathode was formed of Mg to have a thickness of 100 Å. With reference to Table 2 and FIGS. 12A and 12B, it may be confirmed that the electron injection layer according to Test Example 7 Ex7 further includes a metal having a high surface energy compared to Test Example 6 Ex6. Thus, the display device according to Test Example 7 Ex7 had no changes in driving voltage, efficiency, and color coordinates over time.

Figure 13:
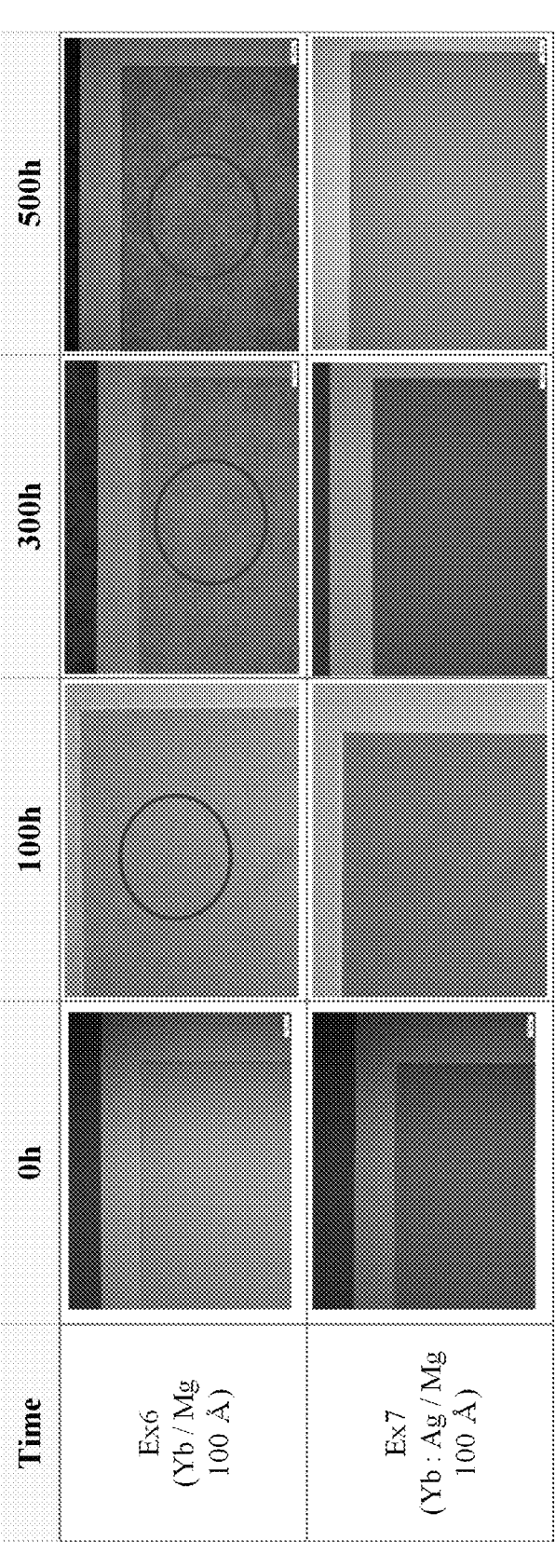
FIG. 13 shows optical microscope images of the display devices according to Test Examples 6 and 7 Ex6 and Ex7 after 0 hours, 100 hours, 300 hours, and 500 hours have elapsed after formation of cathodes.

FIG. 13 shows optical microscope images of the display devices according to Test Examples 6 and 7 Ex6 and Ex7 after 0 hours, 100 hours, 300 hours, and 500 hours have elapsed after formation of the cathodes.

With reference to FIG. 13, it may be confirmed that the sand grain effect was observed in the display device according to Test Example 6 Ex6 respectively after 100 hours, 300 hours, and 500 hours at a high temperature (100° C.) has elapsed after formation of the cathode. However, no defect was observed in the display device according to Test Example 7 Ex7, even after 500 hours had elapsed after formation of the cathode.

Figure 14A:
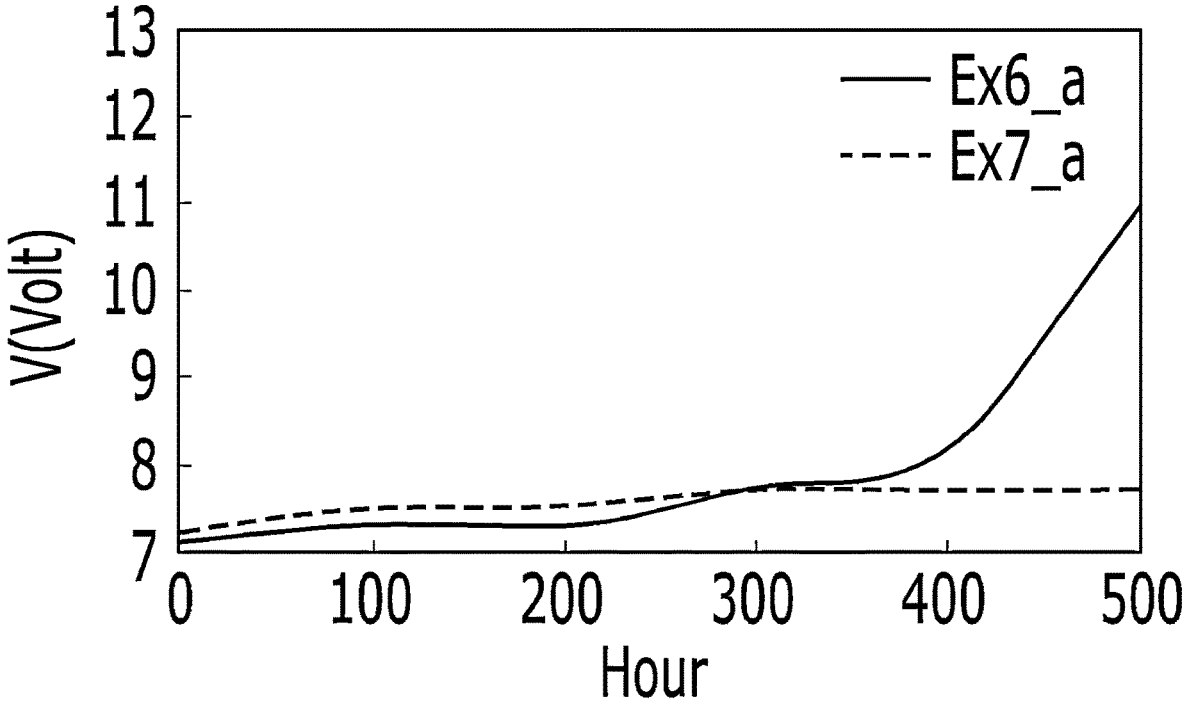
FIGS. 14A and 14B are graphs representing changes in driving voltage and changes in efficiency of display devices according to Modified Examples Ex6_a and Ex7_a of Test Example 6 Ex6 and Test Example 7 Ex7 over time when green light is emitted.
Figure 14B:
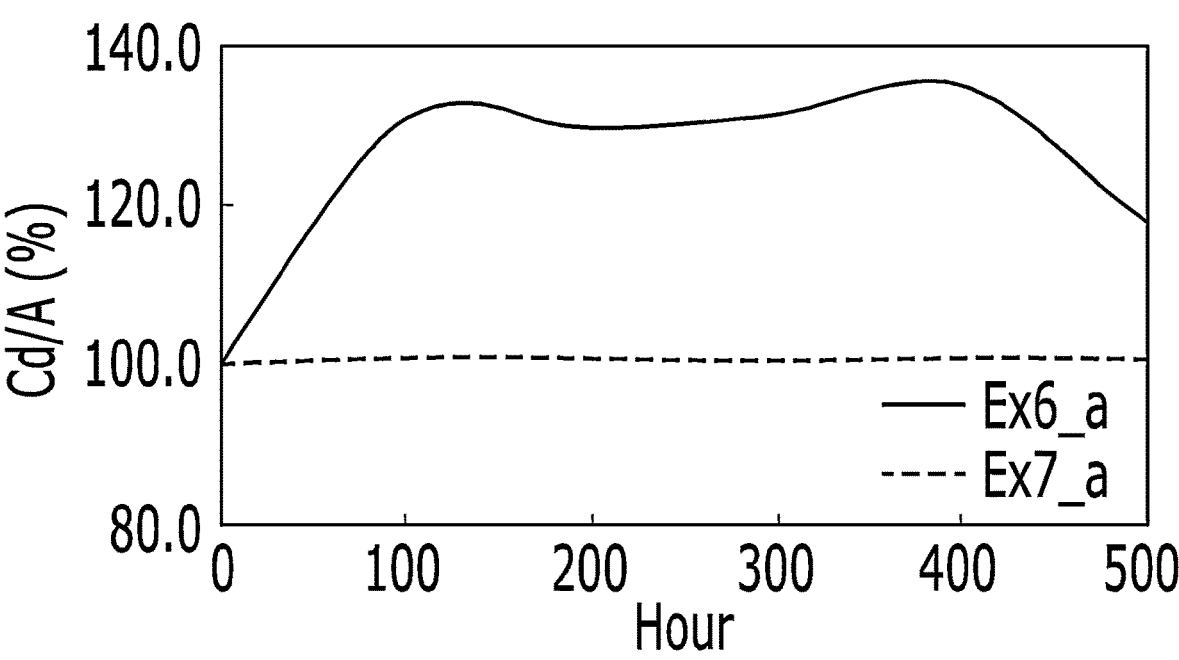
Figure 15:
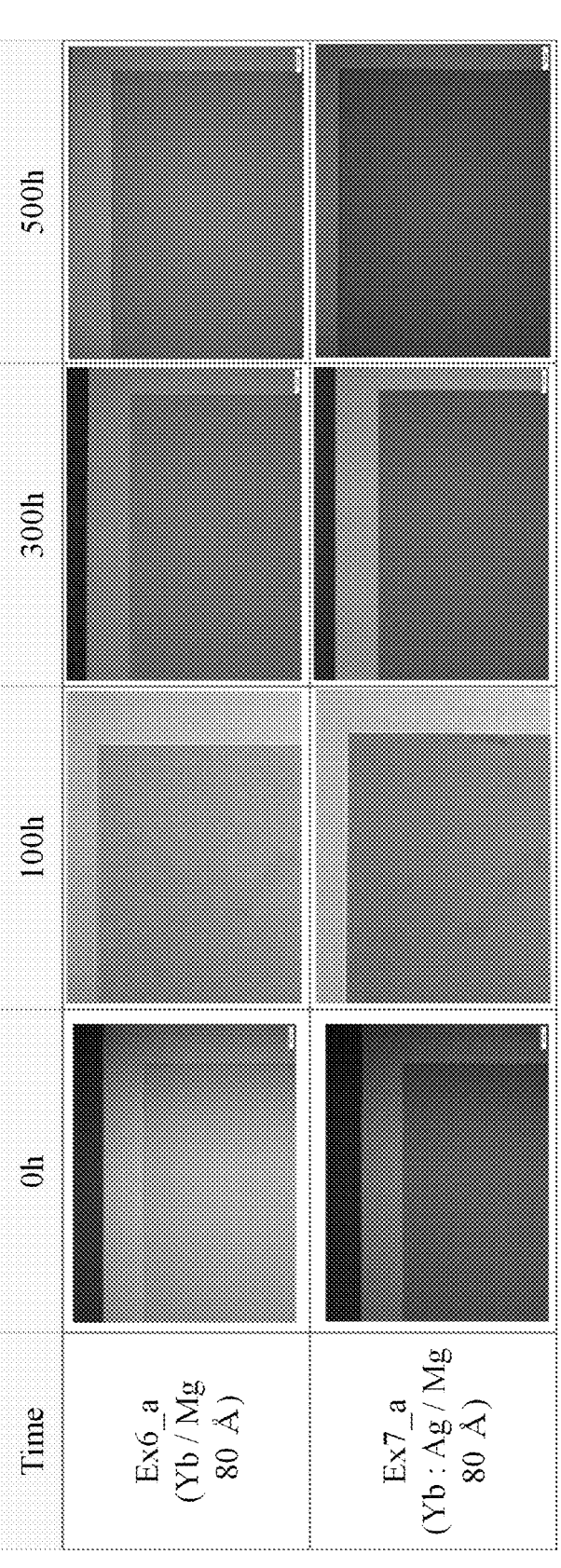
FIG. 15 shows optical microscope images of the display devices according to Modified Examples Ex6_a and Ex7_a of Test Example 6 Ex6 and Test Example 7 Ex7 after 500 hours have elapsed after formation of cathodes.

FIGS. 14A and 14B are graphs representing changes in driving voltage and changes in efficiency of display devices according to Modified Examples Ex6_a and Ex7_a of Test Example 6 Ex6 and Test Example 7 Ex7 over time when green light is emitted. FIG. 15 shows optical microscope images of the display devices according to Modified Examples Ex6_a and Ex7_a of Test Example 6 Ex6 and Test Example 7 Ex7 after 500 hours have elapsed after formation of cathodes.

TABLE 3

| Classification | Optical characteristics (after 0 hours at 100° C.) | | | | Optical characteristics (after 500 hours at 100° C.) | | | | |
| | Driving voltage (V) | Efficiency (%) | CIEx | CIEy | Driving voltage (V) | Efficiency (%) | CIEx | CIEy | $\lambda_{max}$ (nm) |
| --- | --- | --- | --- | --- | --- | --- | --- | --- | --- |
| Ex6_a | 7.1 | 100 | 0.289 | 0.676 | 11 | 117 | 0.296 | 0.669 | 528 |
| Ex7_a | 7.2 | 100 | 0.277 | 0.682 | 7.7 | 101 | 0.277 | 0.682 | 526 |

The above respective Test Examples were evaluated when green light was emitted. In Modified Example Ex6_a of Test Example Ex6, an electron injection layer was formed of Yb, which is an electron-injecting metal, to have a thickness of 40 Å, and a cathode was formed of Mg to have a thickness of 80 Å. In Modified Example 7 Ex7_a of Test Example 7 Ex7, an electron injection layer was formed of an alloy including Yb, which is an electron-injecting metal, and Ag having a surface energy greater than 1 J/m² to have a thickness of 40 Å, and a cathode was formed of Mg to have a thickness of 80 Å. As set forth in Table 3, it may be confirmed that, when the thickness of the cathode was set to 80 Å in Modified Example Ex6_a of Test Example Ex6, after 500 hours at a high temperature of 100° C. had elapsed, the driving voltage of the display device was 11 V, which was increased from the initial voltage by 3.9 V. Also, after storage at a high temperature, the driving voltage was remarkably changed, and the efficiency of the display device was also greatly changed over time, as shown in FIGS. 14A and 14B.

On the other hand, it may be confirmed that in Modified Example 7 Ex7_a of Test Example 7 Ex7, even though the thickness of the cathode was reduced, the driving voltage or the efficiency of the display device was little changed, even after 500 hours at a high temperature have elapsed. Further, it may be confirmed that in Modified Example 7 Ex7_a of Test Example 7 Ex7, color coordinates of the display device were little changed, and thus there was no loss of light emitted by the light-emitting devices.

With reference to FIG. 15, it may be confirmed that the sand grain effect was observed in the display device according to Modified Example Ex6_a of Test Example 6 Ex6 after 500 hours at a high temperature had elapsed. However, no defect occurred in the display device according to Modified Example 7 Ex7_a of Test Example 7 Ex7, even after 500 hours at a high temperature had elapsed.

Hereinafter, optical characteristics and reliabilities of display devices according to Modified Examples of Test Example 7 Ex7, acquired by changing the composition ratio of the electron-injecting metal to the metal having a high surface energy, included in the electron injection layer in Test Example 7 Ex7, will be examined.

Figure 16:
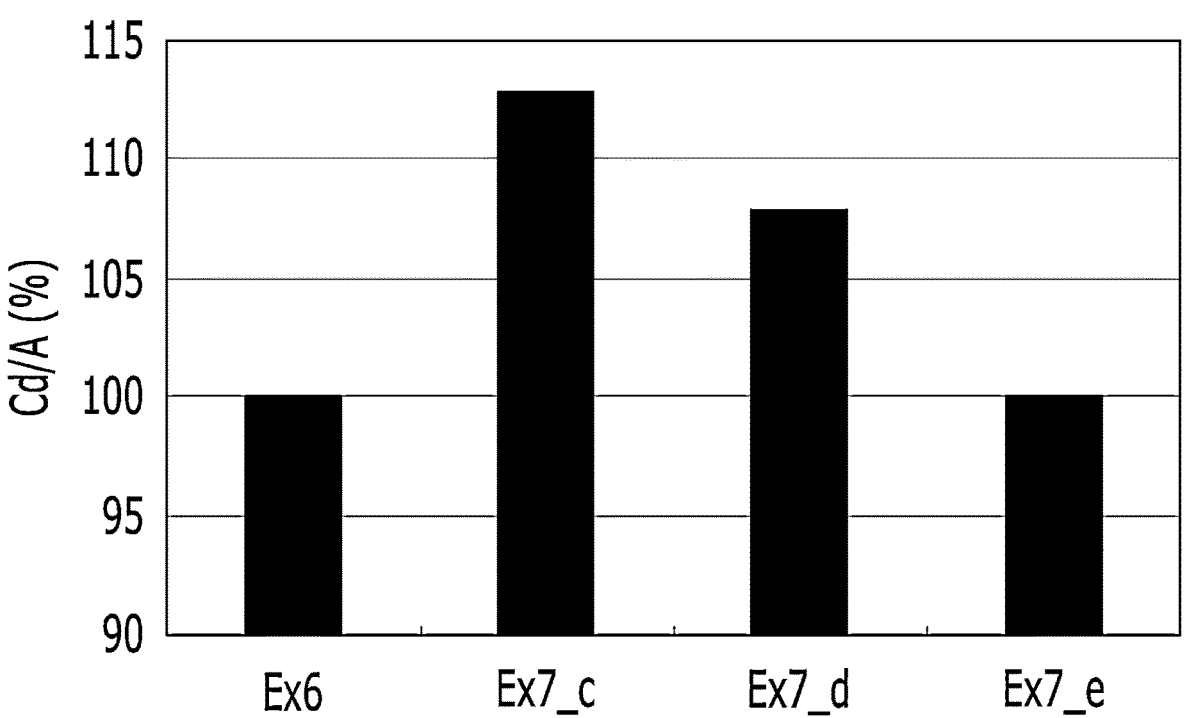
FIG. 16 is a graph representing blue luminous efficacies of display devices according to Test Example 6 Ex6 and Modified Examples Ex7_c, Ex7_d, and Ex7_e of Test Example 7 Ex7.
Figure 17:
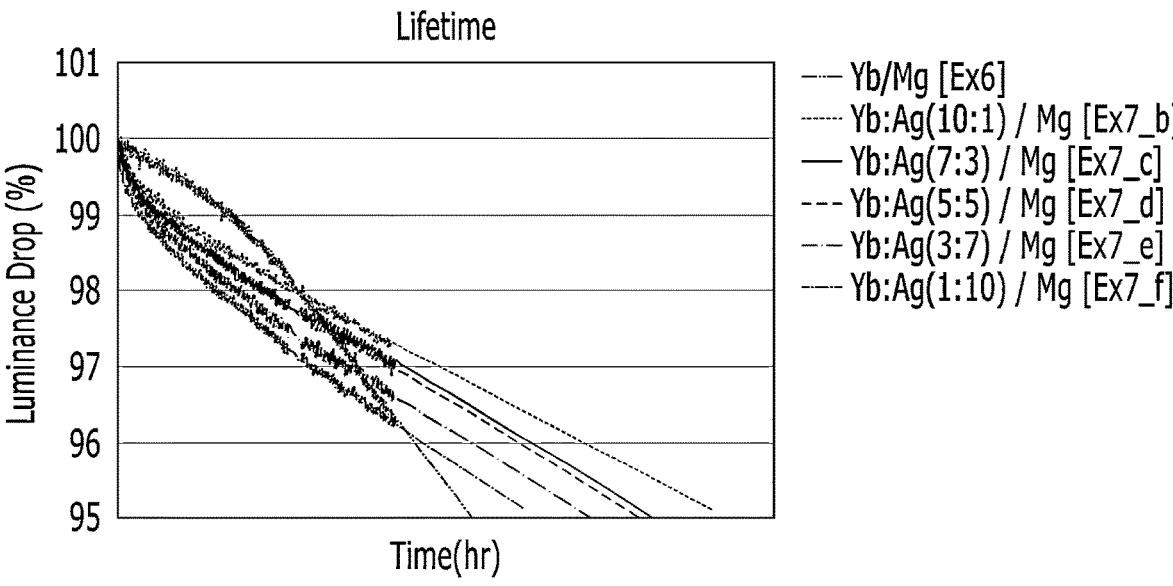
FIG. 17 is a graph representing changes in luminance of the display devices according to Example 6 Ex6 and Modified Examples Ex7_c, Ex7_d, and Ex7_e of Test Example 7 Ex7 over time.

FIG. 16 is a graph representing efficiencies of display devices according to Test Example 6 Ex6 and Modified Examples Ex7_c, Ex7_d, and Ex7_e of Test Example 7 Ex7 when blue light is emitted. FIG. 17 is a graph representing changes in luminance of the display devices according to Example 6 Ex6 and Modified Examples Ex7 b, Ex7_c, Ex7_d, Ex7_e, and Ex7_f of Test Example 7 Ex7 over time.

40 Å, and cathodes were formed of magnesium (Mg) to have a thickness of 100 Å.

Further, in Test Example Ex6, the electron injection layer was formed of Yb, which is an electron-injecting metal, to have a thickness of 40 Å, and in Modified Examples Ex7 b, Ex7_c, Ex7_d, Ex7_e, and Ex7_f of Test Example 7 Ex7, electron injection layers were formed of an alloy including Yb, which is an electron-injecting metal, and Ag having a high surface energy at different composition ratios of 10:1, 7:3, 5:5, 3:7, and 1:10. Thereafter, optical characteristics, lifespans, and reliabilities of the display devices according to Test Example Ex6 and Modified Examples Ex7_b, Ex7_c, Ex7_d, Ex7_e, and Ex7_f of Test Example 7 Ex7 were evaluated after 500 hours at a high temperature of 100° C. had elapsed.

The composition ratio of Yb:Ag in Modified Examples Ex7_b, Ex7_c, Ex7_d, Ex7_e, and Ex7_f of Test Example 7 Ex7 is a volume ratio of Yb:Ag in the electron injection layer. For example, a composition ratio of 7:3 means that the electron injection layer includes 70 vol % of Yb and 30 vol % of Ag.

The evaluated efficiencies of the display devices according to Modified Examples Ex7_b, Ex7_c, Ex7_d, Ex7_e, and Ex7_f of Test Example 7 Ex7 are values expressed as percentages with respect to the efficiency of the display device according to Test Example 6, presuming that the efficiency of the display device according to Test Example 6 is 100%. The lifespans of the display devices according to Modified Examples E Ex7 b, Ex7_c, Ex7_d, Ex7_e, and Ex7_f of Test Example 7 Ex7 are values expressed as percentages with respect to the lifespan of the display device according to Test Example 6, presuming that the lifespan of the display device according to Test Example 6 is 100%.

With reference to Table 4 and FIGS. 16 and 17, it may be confirmed that the display devices according to Modified Examples Ex7_c, Ex7_d, and Ex7_f of Test Example 7 Ex7, in which the ratios of Yb:Ag in the electron injection layer were, respectively, 7:3, 5:5, and 3:7, were stable in terms of driving voltage, efficiency, lifespan, and color coordinates, and exhibited excellent reliability.

As set forth in Table 4, it may be confirmed that the display device according to Modified Example 7 Ex7_f of Test Example 7 Ex7, in which the ratio of Yb:Ag in the electron injection layer was 1:10, was excellent in terms of lifespan, color coordinates, driving voltage, and reliability, but had an efficiency inferior to that of the display device according to Test Example 6 Ex6.

TABLE 4

| Classification | EIL (Yb:Ag) | Driving voltage (V) | Efficiency (%) | CIEx | CIEy | $\lambda_{max}$ (nm) | Lifespan (%) | Reliability |
|---|---|---|---|---|---|---|---|---|
| | | | Optical characteristics | | | | | |
| Ex6 | 1:0 | 7.7 | 100 | 0.138 | 0.050 | 462 | 100 | NG |
| Ex7_b | 10:1 | 7.8 | 117 | 0.135 | 0.055 | 464 | 180 | NG |
| Ex7_c | 7:3 | 7.8 | 113 | 0.138 | 0.050 | 462 | 160 | OK |
| Ex7_d | 5:5 | 7.8 | 108 | 0.137 | 0.053 | 462 | 160 | OK |
| Ex7_e | 3:7 | 7.8 | 100 | 0.138 | 0.050 | 462 | 150 | OK |
| Ex7_f | 1:10 | 8.0 | 92 | 0.137 | 0.053 | 462 | 130 | OK |

In Test Example Ex6 and Modified Examples Ex7_b, Ex7_c, Ex7_d, Ex7_e, and Ex7_f of Test Example 7 Ex7, electron injection layers were formed to have a thickness of The above test means that, when the electron injection layer includes an electron-injecting metal and a metal having a surface energy greater than 1 J/m², the metal having a surface energy greater than 1 J/m$^2$ may improve film properties of the upper surface thereof on which the cathode is deposited, and thus may improve bonding properties between the electron injection layer and the cathode formed of a single component. However, because, when the electron injection layer includes the metal component having a high surface energy, which exceeds 70 vol %, particles of the metal component having a high surface energy may agglomerate, and the electron injection layer may include 30 vol % to 70 vol % of the metal component having a high surface energy (SE).

In the display device according to one embodiment of the present disclosure, the electron injection layer formed of an alloy may be configured to have a surface energy equal to or the cathode may cover the surface of the electron injection layer provided under the cathode to form a thermodynamically stable system, and may thus form a flat thin film without roughness along the surface of the electron injection layer.

Figure 18A:
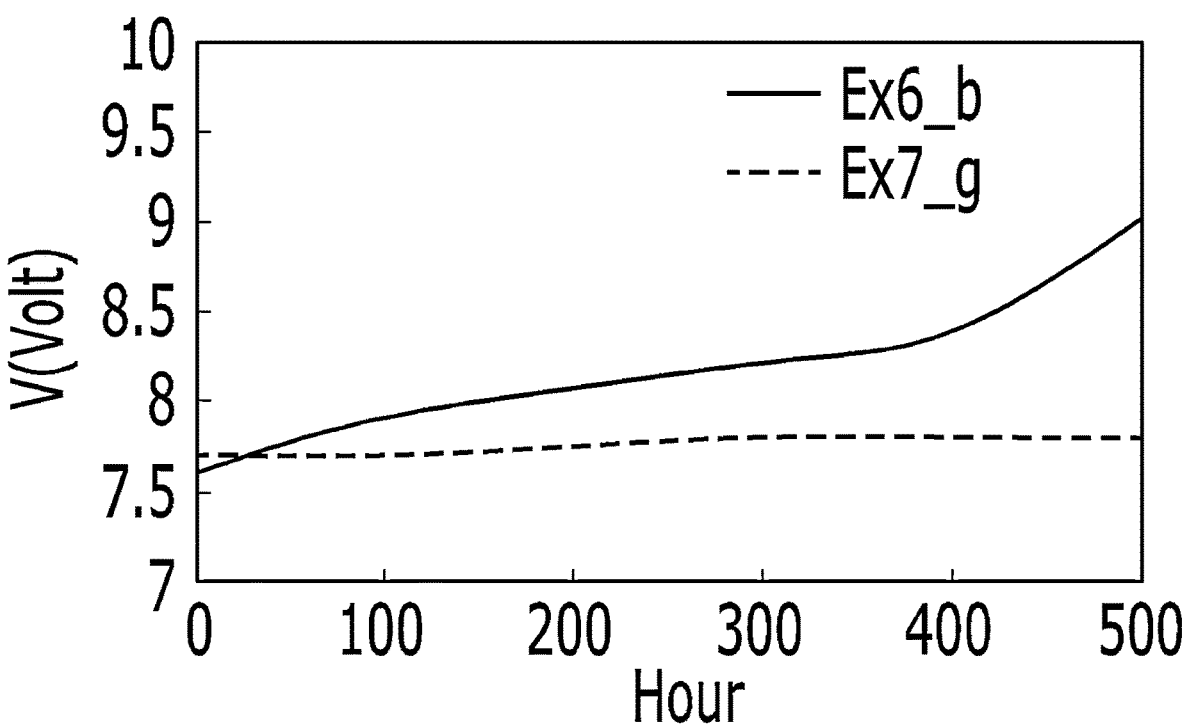
FIGS. 18A and 18B are graphs representing changes in driving voltage and changes in efficiency in the display devices according to Test Example 6 Ex6 and Test Example 7 Ex7 over time when blue light is emitted.
Figure 18B:
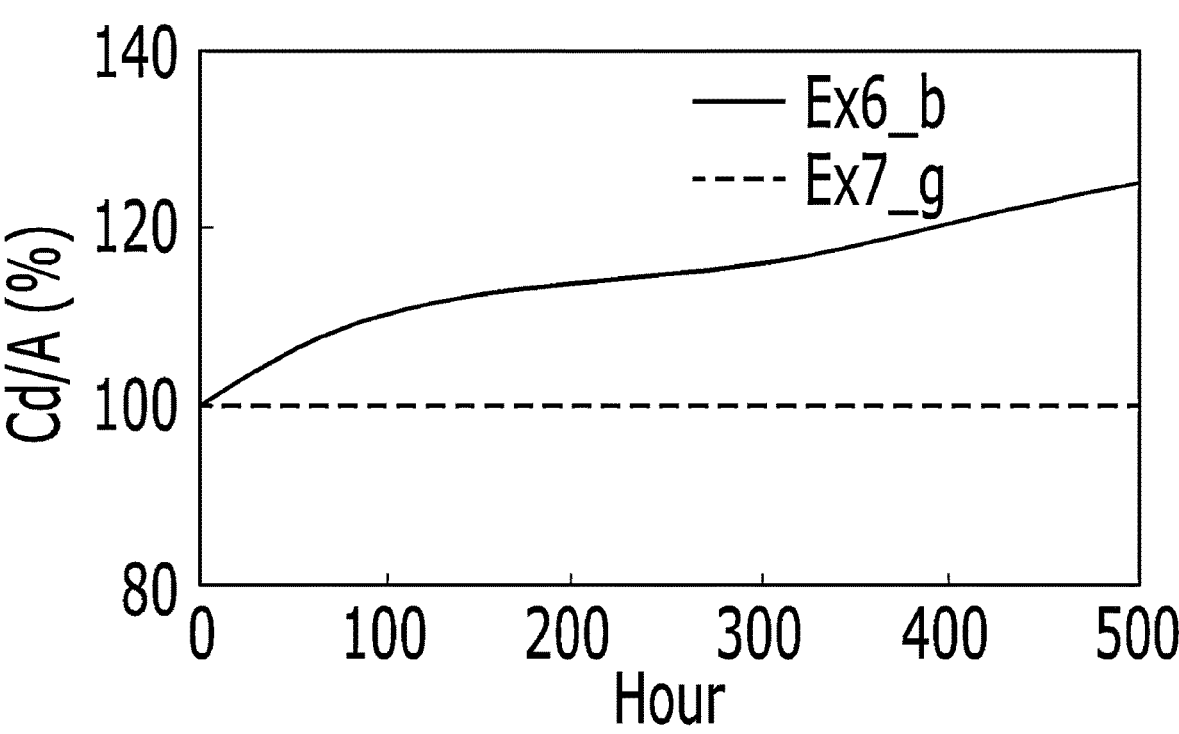
Figure 19A:
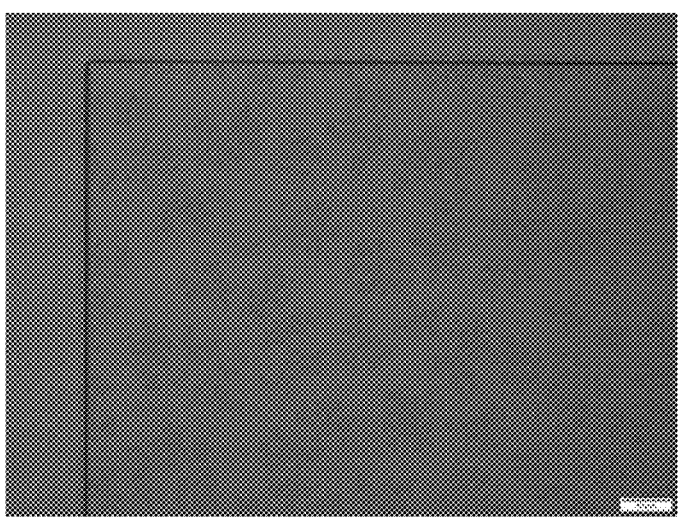
FIGS. 19A and 19B are optical microscope images of the display devices according to Test Examples 6 and 7 Ex6 and Ex7 after 500 hours have elapsed.
Figure 19B:
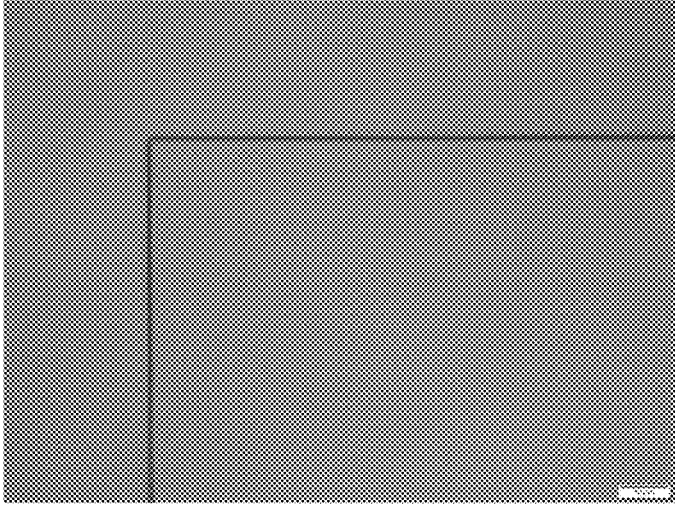

FIGS. 18A and 18B are graphs representing changes in driving voltage and changes in efficiency in the display devices according to Modified Example Ex6_b of Test Example 6 Ex6 and Modified Example Ex7_g of Test Example 7 Ex7 over time when blue light is emitted. FIGS. 19A and 19B are optical microscope images of the display devices according to Modified Example Ex6_b of Test Example 6 Ex6 and Modified Example Ex7_g of Test Example 7 Ex7 after 500 hours have elapsed.

TABLE 6

| Classification | Optical characteristics (after 0 hours at 100° C.) | | | | Optical characteristics (after 500 hours at 100° C.) | | | |
|---|---|---|---|---|---|---|---|---|
| | Driving voltage (V) | Efficiency (%) | CIEx | CIEy | Driving voltage (V) | Efficiency (%) | CIEx | CIEy |
| Ex6_b | 7.6 | 100 | 0.143 | 0.044 | 9 | 120 | 0.142 | 0.046 |
| Ex7_g | 7.6 | 100 | 0.142 | 0.044 | 7.8 | 100 | 0.142 | 0.046 | slightly higher than the surface energy of the cathode. Thus, the surface state of the electron injection layer, on which the cathode is deposited, may be stabilized, and bonding properties between the electron injection layer and the cathode provided thereon may be improved.

The surface energy of magnesium (Mg), used as the cathode, is 0.78 J/m$^2$. The surface energy of Yb, used as the electron-injecting metal of the electron injection layer, is 0.5 J/m$^2$. The surface energy of Ag, used as the metal having a high surface energy of the electron injection layer, is 1.25 J/m$^2$.

Table 5 below represents surface energy of the electron injection layer when the ratio of Yb, used as the electron-injecting metal, to Ag, used as the metal having a high surface energy, varies.

TABLE 5

| | Yb | Ag | SE (J/m$^2$) |
|---|---|---|---|
| Ratio | 1 | 0.1 | 0.57 |
| | 0.7 | 0.3 | 0.73 |
| | 0.6 | 0.4 | 0.80 |
| | 0.5 | 0.5 | 0.88 |
| | 0.3 | 0.7 | 1.03 |
| | 0.1 | 1 | 1.18 |

As set forth in Table 5, when the electron injection layer includes Yb and Ag in the ratio of 7:3, the surface energy of the electron injection layer is 0.73 J/m$^2$, which is within an error range (0.1 J/m$^2$) with the surface energy of magnesium which is 0.78 J/m$^2$. Therefore, the electron injection layer including Yb and Ag in the ratio of 7:3 has a surface energy that is approximately equivalent to the surface energy of the cathode formed of magnesium (Mg), provided on the electron injection layer. In the display device according to one embodiment of the present disclosure, the surface energy of the electron injection layer may be set to be greater than or equal to the surface energy of the cathode deposited on the electron injection layer using a specific ratio of metals forming the alloy included in the electron injection layer. Thus, when the metal material of the cathode is deposited, The above respective Test Examples were evaluated when blue light is emitted. In Modified Example Ex6_b of Test Example Ex6, an electron injection layer was formed of Yb, which is an electron-injecting metal, to have a thickness of 40 Å, and a cathode was formed of Mg to have a thickness of 100 Å. In Modified Example 7 Ex7_g of Test Example 7 Ex7, an electron injection layer was formed of an alloy including Yb, which is an electron-injecting metal, and Ag having a surface energy greater than 1 J/m$^2$ in a ratio of 1:1 to have a thickness of 40 Å, and a cathode was formed of Mg to have a thickness of 100 Å.

As set forth in Table 6, it may be confirmed that, when the thickness of the cathode was set to 100 Å in Test Example Ex6, after 500 hours at a high temperature of 100° C. had elapsed, the driving voltage of the display device was 9 V, which was increased from the initial voltage by 1.4 V. Also, after storage at the high temperature, the driving voltage was remarkably changed, and the efficiency of the display device was also greatly changed over time, as shown in FIGS. 18A and 18B. Therefore, as shown in the optical microscope image of FIG. 19A, it may be confirmed that the sand grain effect occurred on the surface of the display device after storage at the high temperature.

On the other hand, with reference to Table 6 and FIGS. 18A and 18B, it may be confirmed that, in Modified Example 7 Ex7_g of Test Example 7 Ex7, the driving voltage or the efficiency of the display device was little changed, even after 500 hours at the high temperature had elapsed. Furthermore, in Modified Example 7 Ex7_g of Test Example 7 Ex7, color coordinates were not changed. Thus, there was no loss of light emitted by light-emitting devices, and, as shown in FIG. 19B, it may be confirmed that no defect occurred on the surface of the display device, even after storage at the high temperature.

Hereinafter, another embodiment of the present disclosure in which a plurality of electron injection layers is provided will be described.

FIG. 20 is a longitudinal-sectional view of a light-emitting device according to a sixth embodiment of the present disclosure.

As shown in FIG. 20, the light-emitting device according to the sixth embodiment of the present disclosure may be provided in the emission part E shown in FIG. 1 and the first region shown in FIG. 3, and may have a substantially similar configuration as the light-emitting device shown in FIG. 11, except that an electron injection layer 360 may have a two-layer structure. A detailed description of the elements of this light-emitting device that are substantially the same as those of the light-emitting device shown in FIG. 11 will thus be omitted.

The electron injection layer 360 may include a first electron injection layer 361 formed of a single metal having an electron-injecting property, and a second electron injection layer 362 formed of an alloy including a first metal having an electron-injecting property and a second metal having a surface energy greater than 1 $J/m^2$. Here, the second electron injection layer 362 may be formed to have a thickness of 20 Å to 30 Å to improve bonding properties to a cathode 370 deposited thereon, and the first electron injection layer 361 may be formed to have a thickness of 10 Å to 20 Å to improve electron injection efficiency into an organic layer 242 formed thereunder, and to reduce or prevent diffusion of a metal material into the organic layer 242. The total thickness of the electron injection layer 360, including the first and second electron injection layers 361 and 362, may not exceed 40 Å.

In the sixth embodiment of the present disclosure, a capping layer 380 on the cathode 370 may be formed of a material having a high coefficient of thermal expansion, for example, a metal fluoride, as described above in Test Examples 3 and 4. However, the capping layer 380 according to the sixth embodiment of the present disclosure is not limited to the metal fluoride. In some cases, even though the capping layer may be formed of an organic capping material, the sand grain effect occurring after storage at a high temperature may be solved.

Hereinafter, the effects of the display device according to the sixth embodiment of the present disclosure will be examined through tests.

Figure 21A:
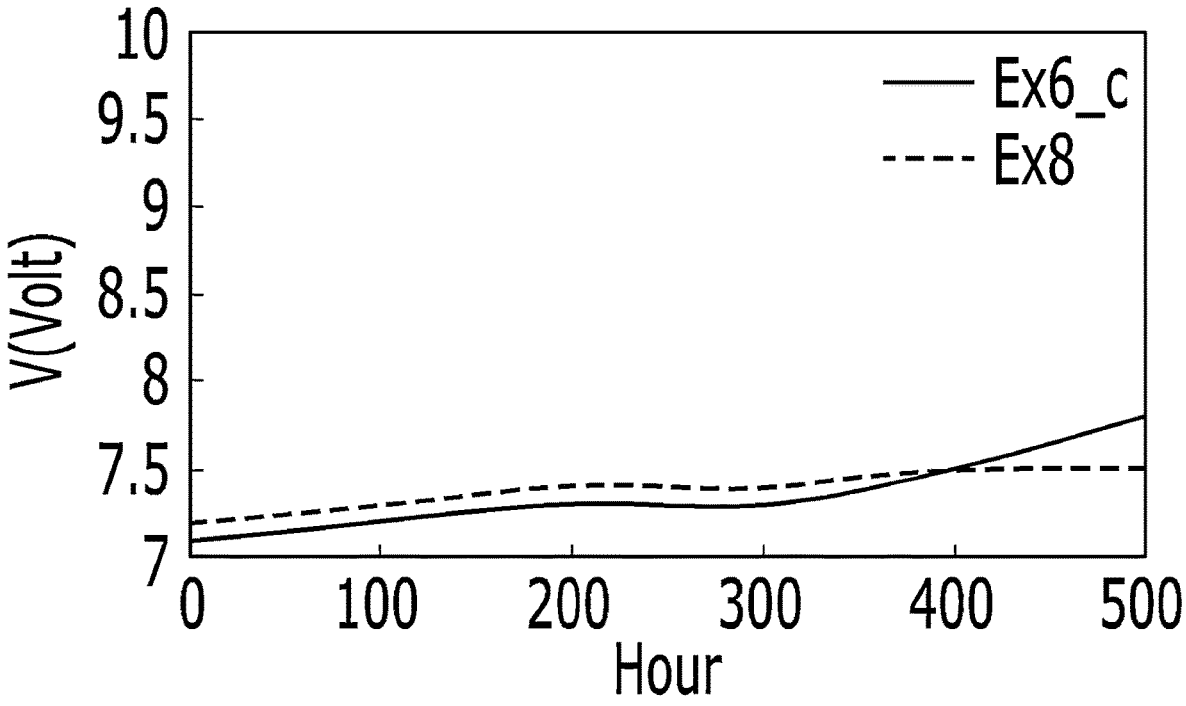
FIGS. 21A and 21B are graphs representing changes in driving voltage and changes in efficiency of display devices according to Test Example 6 Ex6 and Test Example 8 Ex8 over time when green light is emitted.
Figure 21B:
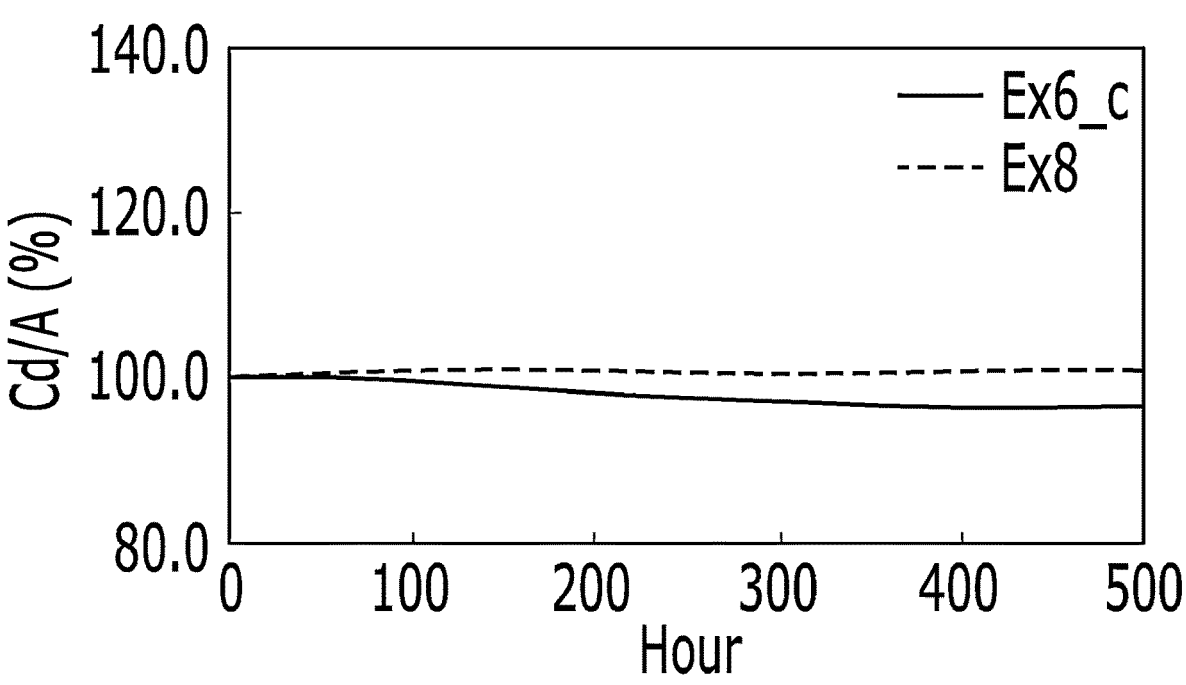
Figure 22:
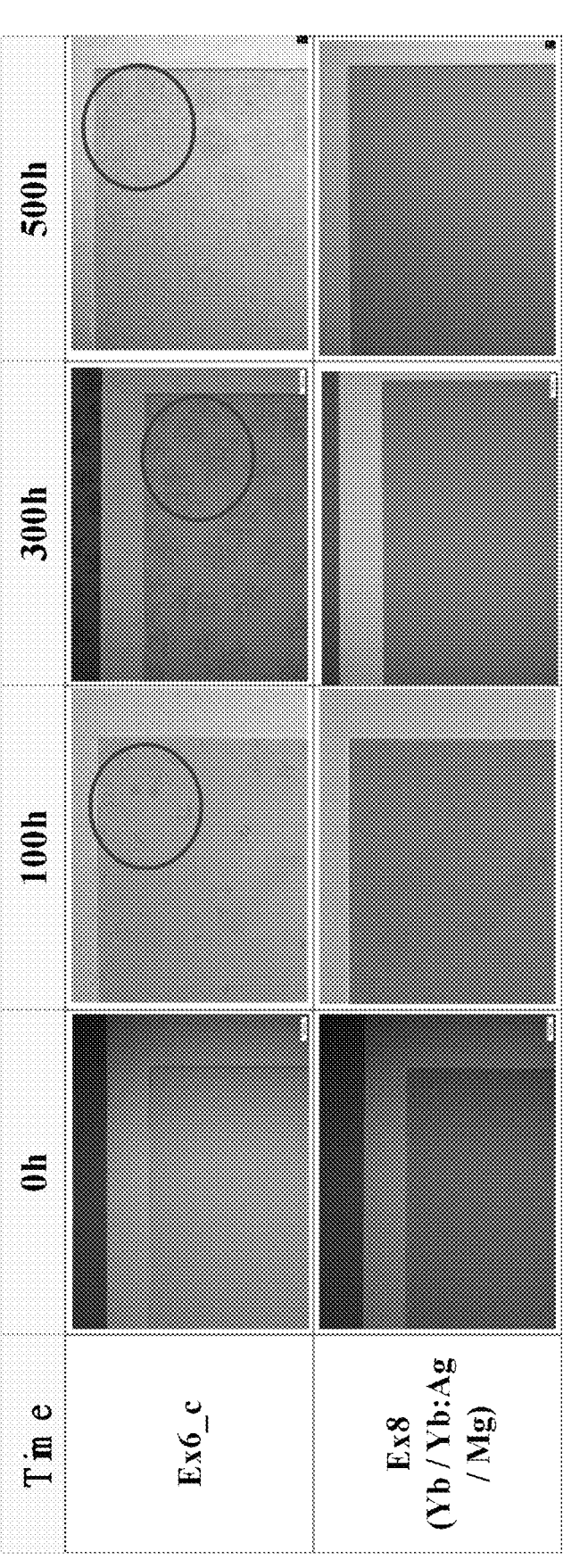
FIG. 22 shows optical microscope images of the display devices according to Test Example 6 Ex6 and Test Example 8 Ex8 after 0 hours, 100 hours, 300 hours, and 500 hours have elapsed.

FIGS. 21A and 21B are graphs representing changes in driving voltage and changes in efficiency of display devices according to Modified Example Ex_c of Test Example 6 Ex6 and Test Example 8 Ex8 over time when green light is emitted. FIG. 22 shows optical microscope images of the display devices according to Modified Example Ex_c of Test Example 6 Ex6 and Test Example 8 Ex8 after 0 hours, 100 hours, 300 hours, and 500 hours have elapsed.

energy greater than 1 $J/m^2$ in a ratio of 1:1 to have a thickness of 40 Å, and a cathode was formed of Mg to have a thickness of 100 Å.

As set forth in Table 7, it may be confirmed that, when the thickness of the cathode was set to 100 Å in Modified Example Ex6_c of Test Example Ex6, after 500 hours at a high temperature of 100° C. had elapsed, the driving voltage of the display device was 7.8 V, which was increased from the initial voltage by 0.7 V. After storage at the high temperature, a change in the driving voltage was greater than a change in the driving voltage of the display device according to Test Example 8 Ex8, and the efficiency of the display device was also greatly changed over time, as shown in FIGS. 21A and 21B. Therefore, as shown in the optical microscope images of FIG. 22, it may be confirmed that the sand grain effect occurred on the surface of the display device after storage at the high temperature.

On the other hand, with reference to Table 6 and FIGS. 21A and 21B, it may be confirmed that, in Test Example 8 Ex8, the driving voltage or the efficiency of the display device was little changed, even after 500 hours at the high temperature had elapsed. Further, in Test Example 8 Ex8, color coordinates were not changed. Thus, there was no loss of light emitted by light-emitting devices, and, as shown in FIG. 22, it may be confirmed that no defect occurred on the surface of the display device, even after storage at the high temperature.

The above-described display device according to the present disclosure allows the transflective cathode formed of a single metal to be patterned to be removed from transmission parts or a region corresponding to a camera, thereby being capable of increasing transmittance of the transmission parts or the region corresponding to the camera. Here, because the cathode may be formed of a single metal having a low work function, even though the cathode is patterned, the cathode (common electrode) has low sheet resistance and may thus maintain a regular potential.

Further, the capping layer located on the cathode may be formed of a material having a smaller coefficient of thermal expansion than the cathode to improve extraction of light emitted by the light-emitting devices, and to protect the light-emitting devices. The capping layer may be changed to have similar tensile force to the cathode in a severe environment, such as at a high temperature, and thus may have excellent high-temperature reliability without a defect at the interface with the cathode.

TABLE 7

| | Optical characteristics (after 0 hours at 100° C.) | | | | | Optical characteristics (after 500 hours at 100° C.) | | | | |
|---|---|---|---|---|---|---|---|---|---|---|
| Classification | Driving voltage (V) | Efficiency (%) | CIEx | CIEy | $\lambda_{max}$ (nm) | Driving voltage (V) | Efficiency (%) | CIEx | CIEy | $\lambda_{max}$ (nm) |
| Ex6_c | 7.1 | 100 | 0.288 | 0.677 | 530 | 7.8 | 96 | 0.293 | 0.671 | 528 |
| Ex8 | 7.2 | 100 | 0.276 | 0.683 | 526 | 7.5 | 101 | 0.277 | 0.682 | 526 |

The respective Test Examples in Table 7 were evaluated when green light was emitted. In Modified Example Ex6_c of Test Example Ex6, an electron injection layer was formed of Yb, which is an electron-injecting metal, to have a thickness of 40 Å, and a cathode was formed of Mg to have a thickness of 100 Å. In Test Example 8 Ex8, an electron injection layer was formed of an alloy including Yb, which is an electron-injecting metal, and Ag having a surface In addition, the electron injection layer located under the cathode may be formed of an alloy including an electron-injecting metal configured to facilitate injection of electrons from the cathode, and a metal having a high surface energy. Thus, the surface energy of the electron injection layer formed of the alloy may be equivalent to or higher than that of the cathode. Therefore, when the cathode is formed on the electron injection layer, the cathode may be deposited on the surface of the electron injection layer with excellent interfacial properties, and a defect caused by release of the metal forming the cathode or agglomeration of metal particles may not occur. Thus, even though the display device may be placed in a high-temperature environment for a long time, surface defects may not occur. Accordingly, the display device may have excellent surface properties, and may reduce or prevent changes in driving voltage and efficiency over time, thereby being stable.

The display device according to the present disclosure may secure interfacial stability on the upper and lower surfaces of the cathode provided in common throughout subpixels, thereby being capable of ultimately preventing a defect on the display surface and securing stability over time and high-temperature reliability. The display device according to the present disclosure is effective in a structure having a patterned cathode, but is not limited thereto.

In the emission parts or the first regions shown in FIGS. 1 and 3, the cathode formed of a single metal and may be provided, the capping layer having a lower coefficient of thermal expansion than the cathode may be provided on the cathode, or the electron injection layer including a first metal having a higher electron-injecting property than the metal forming the cathode and a second metal having a higher surface energy than the metal forming the cathode may be provided under the cathode. As such, embodiments may be capable of promoting surface stability of the cathode formed of the single metal and improving high-temperature reliability in terms of optical characteristics, such as lifespan, driving voltage, color coordinates, efficiency, etc. Further, the above-described effects may be exhibited by applying any one of the electron injection layer and the capping layer described in the display device according to the present disclosure, or by applying both the electron injection layer and the capping layer.

As such, a display device according to an embodiment may include a substrate including: a first region, and a second region, an anode at the first region, an organic layer on the anode at the first region, and on the second region, an electron injection layer on the organic layer at the first region and the second region, the electron injection layer including a first metal, a cathode on the electron injection layer at the first region, the cathode including a second metal having a greater work function than a work function of the first metal, and a capping layer on the cathode at the first region, and on the electron injection layer at the second region.

The capping layer may have a greater coefficient of thermal expansion than a coefficient of thermal efficient of the cathode. The capping layer may include a metal fluoride. The metal fluoride may include an alkaline-earth metal or a transition metal.

The cathode may include magnesium (Mg), and the capping layer may include one or more of: ytterbium fluoride ($YbF_3$) and magnesium fluoride ($MgF_2$). The capping layer may include a plurality of capping layers, and, among the capping layers, a first capping layer, disposed to contact the cathode, and a second capping layer, disposed farthest away from the cathode, may include different metal fluorides. The display device may further include an organic capping layer between the first capping layer and the second capping layer.

The display device may further include an inorganic passivation film on the capping layer, wherein coefficients of thermal expansion of the cathode, the capping layer, and the inorganic passivation film may be decreased in order. The electron injection layer may further include a third metal configured to have surface energy greater than or equal to 1

$J/m^2$, and the cathode may be transflective and may have a surface energy between a surface energy of the first metal and a surface energy of the third metal. The electron injection layer may include 30 vol % to 70 vol % of the third metal. A thickness of the electron injection layer may be 20 Å to 40 Å. The first metal may include one or more of: ytterbium (Yb), barium (Ba), calcium (Ca), and strontium (Sr), and the third metal may include one or more of: silver (Ag), aluminum (Al), and gold (Au).

The electron injection layer may include: a first layer including the first metal, and a second layer including an alloy including the first metal and a third metal, the second layer having a surface energy greater than or equal to 1 $J/m^2$, the second layer contacting the cathode. The electron injection layer may have a surface energy equivalent to or higher than a surface energy of the cathode.

The cathode may have a work function less than or equal to 4 eV, a surface energy less than 1 $J/m^2$, and a thickness of 50 Å to 140 Å.

The display device may further include a camera under the substrate corresponding to the second region. The display device may further include a color filter layer on the capping layer corresponding to the first region.

A display device according to an embodiment may include: a substrate including: an emission part, and a transmission part, an anode at the emission part, an organic layer on the anode at the emission part, and on the transmission part, an electron injection layer on the organic layer, the electron injection layer including: an alloy including a first metal having an electron-injecting property, and a second metal having a surface energy greater than or equal to 1 $J/m^2$, a cathode provided on the electron injection layer at the emission part, the cathode including a single metal having a work function between work functions of the first metal and the second metal, and a capping layer on the cathode, the capping layer having a lower coefficient of thermal expansion than a coefficient of thermal expansion of the cathode.

The capping layer may include a metal fluoride including one or more of: an alkaline-earth metal and a transition metal. The display device may further include: an inorganic passivation film on the capping layer, wherein a coefficient of thermal expansion of the inorganic passivation film may be lower than the coefficient of thermal expansion of the capping layer.

The electron injection layer may include 30 vol % to 70 vol % of the second metal. The work function of the single metal forming the cathode may be smaller than a work function of the second metal, and the single metal may be transflective.

The capping layer may include a plurality of capping layers, and among the capping layers, a first capping layer, disposed to contact the cathode, and a second capping layer, disposed farthest away from the cathode, may include different metal fluorides. The display device may further include an organic capping layer between the first capping layer and the second capping layer.

The electron injection layer may include: a first layer including the first metal, and a second layer including an alloy including the first metal and the second metal, the second layer contacting the cathode. The electron injection layer may include 30 vol % to 70 vol % of the second metal.

The first metal of the electron injection layer may include one or more of: ytterbium (Yb), barium (Ba), calcium (Ca), and strontium (Sr), the second metal may include one or more of: silver (Ag), aluminum (Al), and gold (Au), and the cathode may include magnesium (Mg). More of the electron injection layer and the capping layer may be provided at the transmission parts than on the cathode.

As is apparent from the above description, a display device according to the present disclosure may have the following effects.

First, the display device according to the present disclosure may allow a transflective cathode formed of a single metal to be patterned to be removed from transmission parts or a region corresponding to a camera, thereby being capable of increasing transmittance of the transmission parts or the region corresponding to the camera.

Second, because the cathode may be formed of a single metal having a low work function, even when the cathode is patterned, the cathode (common electrode) may have low sheet resistance, and may thus maintain a regular potential.

Third, a capping layer located on the cathode may be formed of a material having a smaller coefficient of thermal expansion than the cathode to improve extraction of light emitted by light-emitting devices, and to protect the light-emitting devices, and the capping layer may be changed to have similar tensile force to the cathode in a severe environment, such as at a high temperature, and thus may have excellent high-temperature reliability without a defect at the interface with the cathode.

Fourth, an electron injection layer located under the cathode may be formed of an alloy including an electron-injecting metal, configured to facilitate injection of electrons from the cathode, and a metal having a high surface energy. Thus, the surface energy of the electron injection layer formed of the alloy may be equivalent to or higher than that of the cathode. Therefore, when the cathode is formed on the electron injection layer, the cathode may be deposited on the surface of the electron injection layer with excellent interfacial properties, and a defect caused by release of the metal forming the cathode or agglomeration of metal particles may not occur. As such, even though the display device may be placed in a high-temperature environment for a long time, surface defects may not occur. Accordingly, the display device may have excellent surface properties, and may prevent changes in driving voltage and efficiency over time, thereby being stable.

Fifth, the display device according to the present disclosure may secure interfacial stability on the upper and lower surfaces of the cathode provided in common throughout subpixels, thereby being capable of ultimately reducing or preventing a defect on the display surface and securing stability over time and high-temperature reliability.

It will be apparent to those skilled in the art that various modifications and variations may be made in the present disclosure without departing from the technical idea or scope of the disclosure. Thus, it is intended that embodiments of the present disclosure cover the modifications and variations of the disclosure provided they come within the scope of the appended claims and their equivalents.

What is claimed is:

1. A display device, comprising:
a substrate comprising:
 a first region; and
 a second region;
a planarization film at the first region, the planarization film having an inclined portion between the first region and the second region;
an anode on the planarization film, the anode being disposed at the first region;
a bank to cover an edge of the anode and the inclined portion of the planarization film;

an organic layer on the anode at the first region, and on the second region;
a common layer on the organic layer at the first region and the second region, and over the inclined portion of the planarization layer, the common layer comprising a first metal;
a cathode on the common layer at the first region, the cathode comprising a second metal different from the first metal; and
a capping layer on the cathode at the first region, and on the common layer at the second region,
wherein the cathode is absent at the second region, and the capping layer is in contact with the common layer at the second region, and
wherein the organic layer comprises a plurality of organic stacks each having a light emitting layer and at least one charge generation layer between adjacent organic stacks.

2. The display device according to claim 1, wherein the cathode has a greater coefficient of thermal expansion than a coefficient of thermal expansion of the capping layer, and has a greater work function than a work function of the first metal.

3. The display device according to claim 2, wherein the capping layer comprises a metal fluoride.

4. The display device according to claim 3, wherein the metal fluoride comprises an alkaline-earth metal or a transition metal.

5. The display device according to claim 1, wherein:
the cathode comprises magnesium (Mg); and
the capping layer comprises one or more of: ytterbium fluoride ($YbF_3$) and magnesium fluoride ($MgF_2$).

6. The display device according to claim 1, further comprising:
an inorganic passivation film on the capping layer,
wherein coefficients of thermal expansion of the cathode, the capping layer, and the inorganic passivation film are decreased in order.

7. The display device according to claim 1, wherein:
the common layer comprises an electron injection layer;
the electron injection layer comprises a third metal configured to have surface energy greater than or equal to $1 \text{ J/m}^2$; and
the cathode is transflective and has a surface energy between a surface energy of the first metal and a surface energy of the third metal.

8. The display device according to claim 7, wherein the electron injection layer comprises 30 vol % to 70 vol % of the third metal.

9. The display device according to claim 7, wherein a thickness of the electron injection layer is 20 Å to 40 Å.

10. The display device according to claim 7, wherein:
the first metal comprises one or more of: ytterbium (Yb), barium (Ba), calcium (Ca), and strontium (Sr); and
the third metal comprises one or more of: silver (Ag), aluminum (Al), and gold (Au).

11. The display device according to claim 1, wherein the common layer has a surface energy equivalent to or higher than a surface energy of the cathode.

12. The display device according to claim 1, wherein the cathode has a work function less than or equal to 4 eV, a surface energy less than $1 \text{ J/m}^2$, and a thickness of 50 Å to 140 Å.

13. The display device according to claim 1, further comprising a camera under the substrate corresponding to the second region.

14. The display device according to claim 1, further comprising a color filter layer on the capping layer corresponding to the anode, wherein an edge of the color filter layer overlaps the inclined portion of the planarization layer.

15. A display device, comprising:

a substrate comprising:

an emission part; and a transmission part;

a planarization film at the substrate, the planarization film having an inclined portion between the emission part and the transmission part;

an anode on the planarization film, the anode being disposed at the emission part;

a bank to cover an edge of the anode and the inclined portion of the planarization film;

an organic layer on the anode at the emission part, and on the transmission part;

a common layer on the organic layer, the common layer comprising:

an alloy comprising a first metal having an electron-injecting property; and a second metal different from the first metal;

a cathode on the common layer at the emission part, the cathode comprising a single metal; and a capping layer on the cathode, wherein the capping layer is in contact with the common layer at the transmission part, wherein the common layer and the capping layer are provided at the transmission part, and the cathode is absent at the transmission part, and wherein the organic layer comprises a plurality of organic stacks each having a light emitting layer and at least one charge generation layer between adjacent organic stacks.

16. The display device according to claim 15, wherein the capping layer comprises a metal fluoride comprising one or more of: an alkaline-earth metal and a transition metal.

17. The display device according to claim 15, further comprising:

an inorganic passivation film on the capping layer, wherein a coefficient of thermal expansion of the inorganic passivation film is lower than the coefficient of thermal expansion of the capping layer.

18. The display device according to claim 15, wherein the common layer comprises 30 vol % to 70 vol % of the second metal.

19. The display device according to claim 15, wherein:

the work function of the single metal forming the cathode is smaller than a work function of the second metal; and the single metal is transflective.

20. The display device according to claim 15, wherein:

the first metal of the common layer comprises one or more of: ytterbium (Yb), barium (Ba), calcium (Ca), and strontium (Sr);

the second metal comprises one or more of: silver (Ag), aluminum (Al), and gold (Au); and the cathode comprises magnesium (Mg).

21. The display device according to claim 15, wherein the common layer comprises an electron injection layer.

22. The display device according to claim 15, further comprising a color filter layer on the capping layer corresponding to the anode.

23. The display device according to claim 22, wherein the color filter overlaps a part of the inclined portion of the planarization film.

24. The display device according to claim 22, wherein an edge of the color filter overlaps an inclined portion of the bank and is adjacent to the transmission part.

25. The display device according to claim 15, wherein an end of the cathode overlaps the inclined portion of the planarization film.

26. The display device according to claim 15, wherein each of the planarization film and the bank comprise organic material.

27. The display device according to claim 15, wherein the planarization film comprises at least one of photo acryl and benzocyclobutene.

28. The display device according to claim 15, wherein the bank surrounds the transmission part.

29. The display device according to claim 15, further comprising an encapsulation structure including at least one organic encapsulation film and an inorganic encapsulation film.

* * * * *